US011825728B2

(12) United States Patent
Singh et al.

(10) Patent No.: US 11,825,728 B2
(45) Date of Patent: Nov. 21, 2023

(54) ORGANIC-INORGANIC METAL HALIDE GLASS

(71) Applicant: Duke University, Durham, NC (US)

(72) Inventors: Akash Singh, Durham, NC (US); Manoj Jana, Durham, NC (US); David B. Mitzi, Durham, NC (US)

(73) Assignee: Duke University, Durham, NC (US)

( * ) Notice: Subject to any disclaimer, the term of this patent is extended or adjusted under 35 U.S.C. 154(b) by 351 days.

(21) Appl. No.: 17/333,862

(22) Filed: May 28, 2021

(65) Prior Publication Data

US 2022/0115593 A1 Apr. 14, 2022

Related U.S. Application Data

(60) Provisional application No. 63/030,967, filed on May 28, 2020.

(51) Int. Cl.
*H10K 71/13* (2023.01)
*H10K 71/15* (2023.01)
*H10K 71/40* (2023.01)

(52) U.S. Cl.
CPC ........... *H10K 71/135* (2023.02); *H10K 71/15* (2023.02); *H10K 71/40* (2023.02)

(58) Field of Classification Search
CPC ...... H10K 71/135; H10K 71/15; H10K 71/40; C07F 7/24; B05D 1/005; B05D 7/24; C03C 17/009; C03C 1/008; C09D 1/00
See application file for complete search history.

(56) References Cited

U.S. PATENT DOCUMENTS 7,084,691 B2 8/2006 Hsu
7,952,919 B2 5/2011 Liu et al.

FOREIGN PATENT DOCUMENTS

WO WO-0107536 A1 * 2/2001 .......... B01F 17/0042

OTHER PUBLICATIONS

ADLER. Semiconducting glasses. J. Non-Cryst. Solids 1985, 73, 205. 10 pages.
Capitani et. al., High-pressure behavior of methylammonium lead iodide (MAPbI3) hybrid perovskite. J. Appl. Phys. 2016. 119, 185901. 23 pages.
Carruthers. Some Modern Methods of Organic Synthesis, 3rd Edition, Cambridge University Press. Cambridge, 1987. TOC only. 7 pages.
Choi et al., Nonlinear Characterization of GeSbS chalcogenide glass waveguides. Sci Rep. Dec. 21, 2016;6:39234. 8 pages.
Clark et. al., Correlated Structural Distributions in Silica Glass. Phys. Rev. B, 2004. 70, 064202. 1-8.
Conradt, Thermodynamics and Kinetics of glass, Springer Handbook of Glass. 2019, 51-77.

(Continued)

*Primary Examiner* — Douglas W Owens
(74) *Attorney, Agent, or Firm* — Casimir Jones, S.C.; Anne M. Reynolds

(57) ABSTRACT

The present disclosure describes an organic-inorganic metal-halide-based semiconducting material that melts at lower temperatures compared to conventional inorganic semiconductors. The hybrid material is structurally engineered to easily access both crystalline and amorphous glassy states, with each state offering distinct physical properties.

20 Claims, 19 Drawing Sheets
(16 of 19 Drawing Sheet(s) Filed in Color)

(56) References Cited

OTHER PUBLICATIONS

Debenedetti et. al., Supercooled and Glassy Water. Physics Today 56, 2003, 6, 40-46.
Dunlap-Shohl et. al., Synthetic Approaches for Halide Perovskite Thin Films. Chem Rev. Mar. 13, 2019;119(5):3193-3295.
Eggleton et al., Chalcogenide photonics. Nat. Photonics 2011, 5(3), 141-148.
Goi et al., Perspective on photonic memristive neuromorphic computing. PhotoniX. 2020. 1:3, 1. 26 pages.
Greaves, Hybrid Glasses: From Metal Organic Frameworks and Co-ordination Polymers to Hydrid Organic Inorganic Perovskites. Springer Handbook of Glass. 2019. pp. 719-770.
Höhne et al., The temperature calibration of scanning calorimeters. Thermochim. Acta 1990, 160, 1, 1-12.
Hu, "3.071 Amorphous Materials. Fall 2015" MIT OpenCourseWare, https://ocw.mit.edu. Retrieved Aug. 3, 2022. 23 pages.
Ielmini et al., In-memory computing with resistive switching devices. Nat. Electon. 2018, 1, 333-343.
Jaffe et al., Halide Perovskites under Pressure: Accessing New Properties through Lattice Compression. ACS Energy Lett. 2017, 2, 1549-1555.
Jana et al.,Organic-to-inorganic structural chirality transfer in a 2D hybrid perovskite and impact on Rashba-Dresselhaus spin-orbit coupling. Nat Commun. Sep. 17, 2020;11(1):4699. 10 pages.
Kagan et al., Organic-inorganic hybrid materials as semiconducting channels in thin-film field-effect transistors. Science. Oct. 29, 1999;286(5441):945-7.
Keirsse et al., Chalcogenide glass fibers used as biosensors. J. Non-Cryst. Solids 2003, 326, 430-433.
Kilinkissa et al., Melting point-solubility-structure correlations in chiral and racemic model cocrytals. CrystEngComm 2020, 22(16), 2766-2771.
Knowles. The Melting Point of Lead Bromide. J. Am. Chem. Soc. 1950, 72(10), 4817.
Lai et al., Structural, optical, and electrical properties of phase-controlled cesium lead iodide nanowires. Nano Research. 2017, 10(4), 1107-1114.
Lankhorst et al., Low-cost and nanoscale non-volatile memory concept for future silicon chips. Nat Mater. Apr. 2005;4(4):347-52.
Larock, Comprehensive Organic Transformations, 3rd Edition, John Wiley & Sons, Inc., New York, 2018. TOC only. 24 pages.
Lee et al., Pressure-induced phase transitions and templating effect in three-dimensional organic-inorganic hybrid perovskites. Phys. Rev. B. 2003. 68, 020103(R. 4 pages.
Lefurgy et al., Energy management for commercial servers. Computer, 2003. vol. 36, No. 12, pp. 39-48.
Leng et al., From bulk to molecularly thin hybrid perovskites. Nat. Rev. Mater. 2020, 5, 482; 19 pages.
Li et al., Melting temperature suppression of layered hybrid lead halide perovskites via organic ammonium cation branching. Chem Sci. Nov. 9, 2018;10(4):1168-1175.
Li et al., Pressure response of halide perovskites with various compositions, dimensionalities, and morphologies. Matter Radiat. at Extremes 2020, 5, 018201;1-15.
Lin et al., Perovskites light-emitting diodes with external quantum efficiency exceeding 20 per cent. Nature. Oct. 2018;562(7726):245-248.
Long et al., Chiral-perovskite optoelectronics. Nat. Rev. Mater. 2020, 5, 423-439.
Lu et al., "Evaluation of Glass-Forming Ability" Bulk Metallic Glasses. Springer. 2008. pp. 87-115.
Lü et al., Enhances structural stability and photo responsiveness of CH3NH3SnI3 perovskite via pressure-induced amorphization and recrystallization. Adv. Mater. 2016. 28, 8663-8668.
Martin, "Advance Vitreous State: The Structure of Glass Section 1: Lecture 2—Fundamentals of Glass Formation: Structural and Kintic Approaches". https://www.lehigh.edu/imi/teched/GlassCSC/Lecture_2_Martin.pdf . Retrieved from the internet Aug. 4, 2022. 46 pages.
Mettler Toledo. Evaluation Possibilities for the Glass Transition. https://www.mt.com/us/en/home/supportive_content/matchar_apps/MatChar_HB401.html. Retrieved from the internet Jul. 25, 2022. 1 page.
Minaev et. al., Glass-formation in chalcogenide systems and periodic system. Semiconductors and Semimetals, 2004. 78, 1-50.
Mitzi et al., Hybrid Field-Effect Transistor Based on a Low-Temperature Melt-Processed Channel Layer. Adv. Mater. 2002, 14(23), 1772-1776.
Mitzi et al., Low-Temperature Melt Processing of Organic-Inorganic Hybrid Films. Chem. Mater. 2002, 14, 2839-2841.
Mitzi. Synthesis, crystal structure, and optical and thermal properties of (C4H9NH3)2MI4 (M D Ge, Sn, Pb). Chem. Mater. 1996. 8(3), 791-800.
Mitzi. Synthesis, Structure, and Properties of Organic-Inorganic Perovskites and Related Materials. Prog. Inorg. Chem. 1999, 48, 1-121.
Mitzi. Templating and structural engineering in organic-inorgnic perovskites. J. Chem. Soc. Dalton Trans. 2001, (1), 1-12.
Mozzi et. al., The structure of vitreous silica. J. Appl. Crystallogr. 1969. 2(4), 164-172.
Musgraves et al., Springer Handbook of Glass. Springer. 2019. TOC only. 24 pages.
NREL Cell Efficiency. WWW.nrel.gov/pv/cell-efficiency.html. Retrieved from the Internet Jul. 25, 2022. 1 page.
Orava et al., 9—Deposition techniques for chalcogenide thin films. Chalcogenide Glasses. Preparation, Properties and Applications. Woodhead Publishing, 2014. 265-309.
Ou et. al., Visible light response, electrical transport, and amorphization in compressed organolead iodine perovskites. Nanoscale. Jun. 2, 2016;8(22):11426-31.
Park et al., Reduction of RESET current in phase change memory devices by carbon doping in GeSBTe films. J. Appl. Phys. 2015, 117, 115703. 1-6.
Perkin Elmer's, Differential Scanning Caliorimetry(DSC) https://www.perkinelmer.com/CMSResources/Images/44-74542GDE_DSCBeginnersGuide.pdf . Retrived from the internet 07-25-2022. 9 pages.
Raoux et al., Phase change materials and phase change memory. MRS Bull. 2014, 39, 703-710.
Raoux et al., Phase change memory (PCM) materials and devices. Advances in Non-Volatile Memory and Storage Technology, 2019. pp. 161-199.
Raoux et. al., Phase change random access memory—a scalable technology. IBM J Res & Dev, 2008. 52, 465-80.
Salinga et al., Monatomic phase change memory. Nat Mater. Aug. 2018;17(8):681-685.
Saparov et. al., Organic-Inorganic Perovskites: Structural Versatility for Functional Materials Design. Chem Rev. Apr. 13, 2016;116(7):4558-96.
Sapori et. al., Quantum confinement and dielectric profiles of colloidal nanoplatelets of halide inorganic and hybrid organic-inorganic perovskites. Nanoscale. Mar. 28, 2016;8(12):6369-78.
Sciortino, One liquid, two glasses. Nat. Mater. 2002, 1, 145-146.
Singh et al., Reversible Crystal-Glass Transition in a Metal Halide Perovskite. Adv. 2020. Mater. 33(3). 2005868. 7 pages.
Smith, March's Advanced Organic Chemistry: Reactions, Mechanism, and Structure, 7th Edition, John Wiley & Sons, Inc., New York, 2013. TOC only. 11 pages.
Sorrell. Organic Chemistry, 2nd edition, University Science Books, Sausalito, 2006. TOC only. 18 pages.
Tuma et al., Stochastic phase-change neurons. Nat Nanotechnol. Aug. 2016;11(8):693-9.
Turnbull. Under what conditions can a glass be formed? Contemp. Phys. 1969, 10, 473-488.
Vargas et al., The Emergence of Halide Layered Double Perovskites. ACS Energy Lett. 2020, 5(11) 3591-3608.
Wang et al., Pressure-Induced Phase Transformation, Reversible Amorphization, and Anomalous Visible Light Response in Organolead Bromide Perovskite. J Am Chem Soc. Sep. 2, 2015;137(34):11144-9.

(56) References Cited

OTHER PUBLICATIONS

Wang et al., Recent Advances on Neuromorphic Systems Using Phase-Change Materials. Nanoscale Res Lett. Dec. 2017;12(1):347. 22 pages.
Wang et al., Stability of perovskite solar cells. Solar Energy Materials and Solar Cells. 2016: 147, 255-275.
Weber. CH3NH3PbX3, ein Pb(II)-System mit kubischer Perowskitstruktur. Z. Naturforsch. 1978. 33 b, 1443-1445.
Wuttig et al., Phase-change materials for rewriteable data storage. Nat Mater. Nov. 2007;6(11):824-32.
Zachariasen et al., The Atomic Arrangement in Glass. J. Am. Chem. Soc. 1932, 54(10), 3841-3851.
Zanotto et al., The glassy state of matter: Its definition and ultimate fate. Journal of Non-Crystalline Solids, 2017. 471, 490-495.

\* cited by examiner

ORGANIC-INORGANIC METAL HALIDE GLASS

CROSS-REFERENCE TO RELATED APPLICATIONS

This application claims priority to U.S. Provisional Patent Application No. 63/030,967, filed on May 28, 2020, the entire contents of which are fully incorporated herein by reference.

STATEMENT REGARDING FEDERALLY SPONSORED RESEARCH

This invention was made with government support under N00014-17-1-2207 awarded by the Office of Naval Research. The government has certain rights in the invention.

BACKGROUND

Historically, glass has been primarily based on silica and other flux adducts. In recent times, different forms of inorganic glasses have emerged and been given various nomenclatures associated with the different base compositions, such as silicate glass, borate glass, phosphate glass, halide glass, chalcogenide glass and metallic glass. Some so-called "hybrid" and organic glasses have also been developed, such as bioactive glass, metal-organic framework and coordination polymer-based glass. Due to the advent of such glasses, a variety of applications have been made possible, ranging from their use in lenses, displays, circuit packaging, dielectrics, catalysts, solid state battery electrolytes, non-linear optics, optical communications and phase change memories. However, the production of such materials remains challenging, due to factors such as exacting manufacturing requirements and their associated costs. Additionally, the ability to tune important glass properties, such as glass transition and melting temperatures, as well as crystallization kinetics, remains limited. Hence, there is an ongoing opportunity for improved glass materials.

SUMMARY

One aspect of the present disclosure provides an organic-inorganic hybrid material comprising, consisting of, or consisting essentially of a metal halide anionic framework, and one or more organic cations, wherein the hybrid material is reversibly switchable between glass and crystalline states.

In some embodiments, the hybrid material comprises alternating layers of metal halide anion layers and organic cation layers.

In some embodiments, the hybrid material comprises a semiconducting, ferroelectric, and/or magnetic perovskite structure.

In some embodiments, the hybrid material has a formula $A_2MX_4$ or $A'MX_4$, wherein A and A' are organic cations, M is a divalent metal cation, and X is a halide anion. In some embodiments, the hybrid material has a formula $A_2MX_4$, wherein A is an organic cation having a formula $R-NH_3^+$, wherein R is an alkyl, aryl, or arylalkyl group. In some embodiments, A has a formula:

$$R^1-(CH_2)_m(CHR^2)(CH_2)_n-NH_3^+$$

wherein: $R^1$ is a bicyclic, tricyclic or tetracyclic aryl, or a bicyclic, tricyclic, or tetracyclic heteroaryl; $R^2$ is hydrogen, $C_1$-$C_4$ alkyl, hydroxy, amino, or halo; m is 0, 1, 2, 3, or 4; and n is 0, 1, 2, 3, or 4. In some embodiments, R is a 1-naphthylethyl group. In some embodiments, R is a (S)-(−)-1-(1-naphthyl)ethyl group or a (R)-(+)-1-(1-naphthyl)ethyl group.

In some embodiments, the hybrid material has a formula $A'MX_4^+$, wherein A' is an organic cation having a formula $H_3N-R^a-NH_3^+$, wherein $R^a$ comprises an alkylene, alkenylene, alkynylene, arylene, or heteroarylene group, or any combination thereof.

In some embodiments, M is selected from $Pb^{2+}$, $Sn^{2+}$, $Ge^{2+}$, $Cu^{2+}$, $Cr^{2+}$, $Ni^{2+}$, $Co^{2+}$, $Fe^{2+}$, $Mn^{2+}$, $V^{2+}$, $Pd^{2+}$, $Cd^{2+}$, $Pt^{2+}$, $Rh^{2+}$, $Eu^{2+}$, $Yb^{2+}$, and $Sm^{2+}$, or any combination thereof.

In some embodiments, the organic cations template the formation of the glass state.

In some embodiments, the halide anion is selected from iodide, bromide, chloride, and fluoride, or any combination thereof.

In some embodiments, the hybrid material has a formula $A_2M^1M^2X_6$, where A is an organic cation, $M^1$ is a monovalent metal cation, $M^2$ is a trivalent metal cation, and X is a halide anion.

In some embodiments, the hybrid material has the following characteristic temperature relationship: $T_g<T_x<T_m<T_d$, wherein $T_g$ is glass transition temperature, $T_x$ is crystallization onset temperature, $T_m$ is melting onset temperature, and $T_d$ is degradation onset temperature.

In some embodiments, switching between states is accompanied by a measurable change in an observable property, wherein the observable property optionally comprises optical absorption, reflectivity, refractive index, magnetic state, and/or electrical conductivity.

In some embodiments, the hybrid material is provided as a film, a sheet, a fiber, and/or a thick section.

In some embodiments, the hybrid material is provided as a film supported on a substrate, the substrate optionally comprising silicon, silicon dioxide, quartz, glass, plastic, metal (e.g., metal foil), or any combination thereof. In some embodiments, the melting temperature of the hybrid material is less than the melting temperature of a substrate.

In another aspect, the present disclosure provides a method for producing a switchable organic-inorganic hybrid material in a glassy amorphous state, comprising: preparing a solution of a metal halide and an organic cation in a solvent; depositing the solution onto a substrate; and evaporating the solvent to produce a film of the hybrid material and impede the crystallization of the hybrid material.

In some embodiments, evaporating comprises rapidly drying the hybrid material, optionally using high-speed spin-coating, slit-casting and air knife blading, or ink jet printing, wherein rapidly drying the hybrid material is achieved during a range of approximately 0.001-30 seconds, such that dynamics of crystallization for the switchable organic-inorganic hybrid are impeded.

In some embodiments, the solvent is selected from water, acetone, methanol, ethanol, propanol, isopropanol, ethylene glycol, acetonitrile, acetic acid, pyridine, chloroform, hydrazine, an amine, dimethylformamide (DMF), dimethyl sulfoxide (DMSO), N-methyl-2-pyrrolidone (NMP), gamma-butyrolactone (GBL), or any combination thereof.

In some embodiments, the solution is prepared by dissolving organic ammonium halide salt and metal halide salt as precursors in organic or inorganic solvents.

Another aspect of the present disclosure provides a process to prepare stable glass of a switchable organic-inorganic hybrid material described herein, comprising: melting single crystals, powdered crystals and/or polycrystalline films of the hybrid material, and cooling at a rate in the range of 1 K/min to $10^{10}$ K/min such that the kinetics of crystallization are impeded. In some embodiments, the melt is held for a sufficient length of time to form a uniform melt without degradation.

In some embodiments, pressure is used to constrain the melt between substrates to produce a laminated glassy amorphous film upon cooling.

In some embodiments, the process comprises removing a substrate after melt formation to produce a glassy amorphous film only on one surface upon cooling.

Another aspect of the present disclosure provides all that is described and illustrated herein.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The following figures are provided by way of illustration and not by way of limitation.

FIGS. 2A-2F show crystal structure characteristics and their impact on the thermal properties of chiral S-(−)-1-(1-naphthyl)ethylammonium lead bromide (S-NPB) and racemic 1-(1-naphthyl)ethylammonium lead bromide (rac-NPB): schematic illustration of: (FIGS. 2A and 2D) 2D layered perovskite structure; (FIGS. 2B and 2E) in-plane views of lead bromide perovskite layer; and (FIGS. 2C and 2F) hydrogen-bonding interactions, in rac-NPB (FIGS. 2A-2C) and S-NPB (FIGS. 2D-2F). In FIGS. 2B and 2E, only the —CH—$NH_3^+$ tethering groups (denoted as dumbbells) of organic spacer cations are shown for clarity. Cyan, red, blue, black and pink spheres denote Pb, Br, N, C, and H atoms, respectively.

FIG. 3A: X-ray diffraction pattern of chiral S-NPB glass showing a broad peak near $2\theta \approx 5.6°$ (green). The broad feature at $2\theta \approx 23°$ is the signature diffraction feature of the soda lime glass substrate (red). Inset shows the broad XRD feature of the S-NPB perovskite glass (green) along with the sharp peaks associated with the corresponding crystalline counterpart (black). The intensity of the XRD peaks are normalized to the largest peak for the crystalline sample. FIG. 3B: Differential scanning calorimetry (DSC) and thermogravimetric analysis (TGA) of the S-NPB glass showing various temperature characteristics such as $T_g$ (glass transition), $T_x$ (crystallization onset), $T_m$ (melting onset) and $T_d$ (degradation onset). The inset shows the zoomed in glass transition region.

(FIG. 4A) Optical microscopic image of S-NPB glassy film and its eventual crystallization (FIG. 4B) at 140° C. While the glassy film appears smooth, the crystallized film exhibits large crystalline domains. Scale bar is 250 μm. (FIG. 4C) X-ray diffraction pattern of chiral perovskite glass films post-annealed at various temperatures. Films annealed at temperatures in excess of 100° C. show sharp crystalline patterns. (FIG. 4D) Ultraviolet-visible absorbance spectroscopy of chiral perovskite glass films post-annealed at different temperatures. The sharp red shift of around 47 nm occurs upon bulk crystallization of the films near ~120° C.

FIG. 5A: X-ray diffraction pattern of S-NPB perovskite film showing reversible switching between glassy (green colored; A1-A5) and crystalline (red colored; C1-C5) state. Due to the low XRD intensity of the amorphous phase diffraction, the pattern appears flat, which is therefore enlarged to show the characteristic broad hump in the inset. FIG. 5B: UV-Vis absorbance spectroscopy of chiral S-NPB films over several thermal cycles showing reversible switching for 5 iterations. A significant shift of 47 nm in the absorption onset distinguishes the two optoelectronic states.

FIGS. 17A-17B show X-ray diffraction patterns of multiple essentially identical S-NPB glassy films before (FIG. 17A) and after (FIG. 17B) annealing at different temperatures. Sample A was annealed at 21° C. and sample I at 160° C., with the rest at temperatures in between.

DETAILED DESCRIPTION

Figure 1:
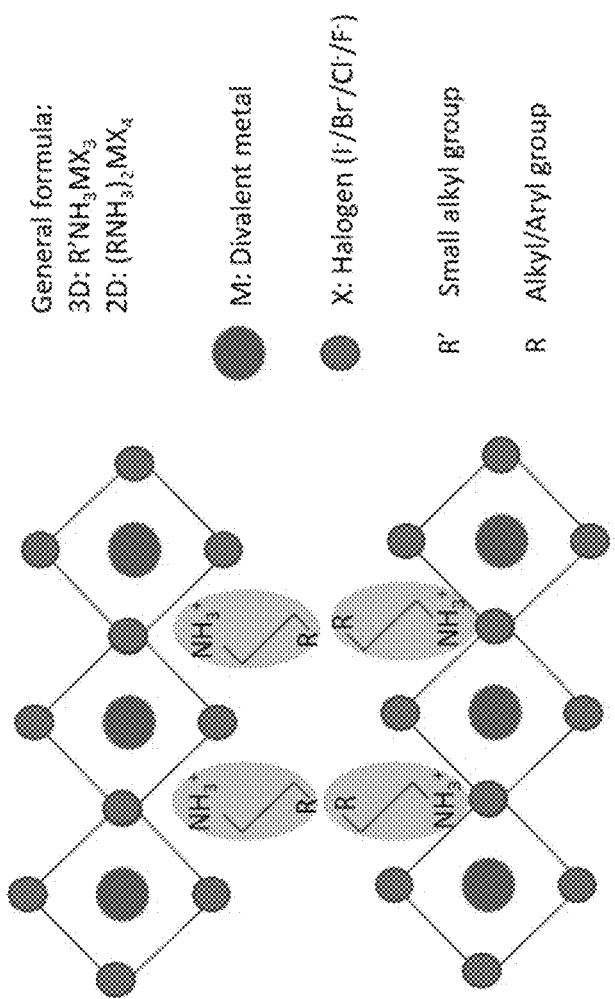
FIG. 1 shows: a schematic representation of the crystal structure of a 3D perovskite with general formula $AMX_3$ where A is small organic ammonium cation (left); and a schematic crystal structure of a 2D perovskite with general formula $A_2MX_4$ where A is large organic ammonium cation (right).
Figure 1:
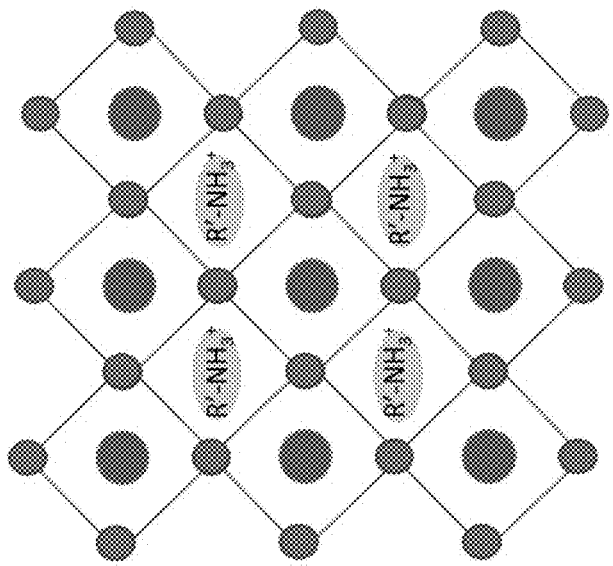

For the purposes of promoting an understanding of the principles of the present disclosure, reference will now be made to preferred embodiments and specific language will be used to describe the same. It will nevertheless be understood that no limitation of the scope of the disclosure is thereby intended, such alteration and further modifications of the disclosure as illustrated herein, being contemplated as would normally occur to one skilled in the art to which the disclosure relates.

Unless otherwise defined, all technical terms used herein have the same meaning as commonly understood by one of ordinary skill in the art to which this disclosure belongs. Definitions of specific functional groups and chemical terms are described in more detail below. For purposes of this disclosure, the chemical elements are identified in accordance with the Periodic Table of the Elements, CAS version, Handbook of Chemistry and Physics, 75th Ed., inside cover, and specific functional groups are generally defined as described therein. Additionally, general principles of organic chemistry, as well as specific functional moieties and reactivity, are described in Sorrell, Organic Chemistry, 2nd edition, University Science Books, Sausalito, 2006; Smith, March's Advanced Organic Chemistry: Reactions, Mechanism, and Structure, 7th Edition, John Wiley & Sons, Inc., New York, 2013; Larock, Comprehensive Organic Transformations, 3rd Edition, John Wiley & Sons, Inc., New York, 2018; and Carruthers, Some Modern Methods of Organic Synthesis, 3rd Edition, Cambridge University Press, Cambridge, 1987; the entire contents of each of which are incorporated herein by reference.

Articles "a" and "an" are used herein to refer to one or to more than one (i.e. at least one) of the grammatical object of the article. By way of example, "an element" means at least one element and can include more than one element.

"About" is used to provide flexibility to a numerical range endpoint by providing that a given value may be "slightly above" or "slightly below" the endpoint without affecting the desired result.

As used herein, the term "alkyl" means a straight or branched saturated hydrocarbon chain. An alkyl group can include, for example, 1 to 16 carbon atoms ($C_1$-$C_{16}$ alkyl), 1 to 14 carbon atoms ($C_1$-$C_{14}$ alkyl), 1 to 12 carbon atoms ($C_1$-$C_{12}$ alkyl), 1 to 10 carbon atoms ($C_1$-$C_{10}$ alkyl), 1 to 8 carbon atoms ($C_1$-$C_8$ alkyl), 1 to 6 carbon atoms ($C_1$-$C_6$ alkyl), or 1 to 4 carbon atoms ($C_1$-$C_4$ alkyl). Representative examples of alkyl include, but are not limited to, methyl, ethyl, n-propyl, iso-propyl, n-butyl, sec-butyl, iso-butyl, tert-butyl, n-pentyl, isopentyl, neopentyl, n-hexyl, 3-methylhexyl, 2,2-dimethylpentyl, 2,3-dimethylpentyl, n-heptyl, n-octyl, n-nonyl, n-decyl, n-undecyl, and n-dodecyl.

As used herein, the term "alkylene" refers to a divalent group derived from a straight or branched chain hydrocarbon, e.g., of 1 to 16 carbon atoms ($C_1$-$C_{16}$ alkylene), for example, 1 to 10 carbon atoms ($C_1$-$C_{10}$ alkylene), or 1 to 6 carbon atoms ($C_1$-$C_6$ alkylene). Representative examples of alkylene include, but are not limited to, —$CH_2$—, —$CH_2CH_2$—, —$CH(CH_3)$—, —$CH_2CH_2CH_2$—, —$CH_2CH(CH_3)$—, —$CH_2CH_2CH_2CH_2$—, —$CH_2CH(CH_3)CH_2$—, —$CH_2CH_2CH(CH_3)$—, —$CH_2CH_2CH_2CH_2CH_2$—, —$CH_2CH(CH_3)CH_2CH_2$—, —$CH(CH_3)CH_2CH_2CH_2$—, —$CH_2CH_2CH_2CH_2CH_2CH_2$—, —$CH_2CH_2CH(CH_3)CH_2CH_2$—, —$CH_2CH(CH_3)CH_2CH_2CH_2$—, and —$CH(CH_3)CH_2CH_2CH_2CH_2$—.

The term "alkenyl," as used herein, means a straight or branched hydrocarbon chain containing at least one carbon-carbon double bond. The double bond(s) may be located at any positions with the hydrocarbon chain. Representative examples of alkenyl include, but are not limited to, ethenyl, 2-propenyl, 2-methyl-2-propenyl, 3-butenyl, 4-pentenyl, 5-hexenyl, 2-heptenyl, 2-methyl-1-heptenyl, and 3-decenyl.

As used herein, the term "alkenylene" refers to a divalent group derived from a straight or branched chain hydrocarbon, e.g., of 2 to 16 carbon atoms and containing at least one carbon-carbon double bond. Representative examples of alkenylene include, but are not limited to, —CH═CH—, —CH═CHCH$_2$—, and —CH$_2$CH═CHCH$_2$—.

The term "alkynyl" as used herein, means a straight or branched hydrocarbon chain containing at least one carbon-carbon triple bond. The triple bond(s) may be located at any positions with the hydrocarbon chain. Representative examples of alkynyl include, but are not limited to, ethynyl, propynyl, and butynyl.

As used herein, the term "amino" refers to a group —$NR_2$, wherein each R is independently selected from hydrogen and alkyl (as defined herein). Accordingly, when the term "amino" is used herein, the term encompasses an —$NH_2$ group, an alkylamino group (e.g., —$NHCH_3$), and a dialkylamino group (—$N(CH_3)_2$).

As used herein, the term "alkynylene" refers to a divalent group derived from a straight or branched chain hydrocarbon, e.g., of 2 to 16 carbon atoms and containing at least one carbon-carbon triple bond. Representative examples of alkynylene include, but are not limited to, —C≡CCH$_2$—, and —CH$_2$C≡CCH$_2$—.

As used herein, the term "aryl" refers to an aromatic carbocyclic ring system having a single ring (monocyclic) or multiple rings (bicyclic, tricyclic, or tetracyclic) including fused ring systems, and zero heteroatoms. As used herein, aryl contains 6-20 carbon atoms (C$_6$-C$_{20}$ aryl), 6-18 carbon atoms (C$_6$-C$_{18}$ aryl), 6 to 14 ring carbon atoms (C$_6$-C$_{14}$ aryl), 6 to 12 ring carbon atoms (C$_6$-C$_{12}$ aryl), or 6 to 10 ring carbon atoms (C$_6$-C$_{10}$ aryl). Representative examples of aryl groups include, but are not limited to, phenyl, naphthyl, anthracenyl, phenanthrenyl, and tetracenyl.

As used herein, the term "arylalkyl" refers to an alkyl group, as defined herein, in which at least one hydrogen atom is replaced with an aryl group, as defined herein. Representative examples of arylalkyl groups include, but are not limited to, benzyl, phenethyl, naphthylmethyl, and naphthyl ethyl groups.

As used herein, the term "arylene" refers to a divalent aryl group, e.g., a phenylene group (e.g., 1,2-phenylene, 1,3-phenylene, and 1,4-phenylene).

As used herein, the term "halogen" or "halo" means F, Cl, Br, or I.

As used herein, the term "heteroaryl" refers to an aromatic group having a single ring (monocyclic) or multiple rings (bicyclic or tricyclic), and having one or more ring heteroatoms independently selected from N, O, S, and P. The aromatic monocyclic rings are five- or six-membered rings containing at least one heteroatom independently selected from N, O, S, and P (e.g., 1, 2, 3, or 4 heteroatoms independently selected from N, O, S, and P). The five-membered aromatic monocyclic rings have two double bonds, and the six-membered aromatic monocyclic rings have three double bonds. The bicyclic heteroaryl groups are exemplified by a monocyclic heteroaryl ring appended fused to a monocyclic aryl group, as defined herein, or a monocyclic heteroaryl group, as defined herein. The tricyclic heteroaryl groups are exemplified by a monocyclic heteroaryl ring fused to two rings independently selected from a monocyclic aryl group, as defined herein, and a monocyclic heteroaryl group as defined herein. Representative examples of monocyclic heteroaryl include, but are not limited to, pyridinyl (including pyridin-2-yl, pyridin-3-yl, pyridin-4-yl), pyrimidinyl, pyrazinyl, pyridazinyl, pyrrolyl, benzopyrazolyl, 1,2,3-triazolyl, 1,3,4-thiadiazolyl, 1,2,4-thiadiazolyl, 1,3,4-oxadiazolyl, 1,2,4-oxadiazolyl, imidazolyl, thiazolyl, isothiazolyl, thienyl, furanyl, oxazolyl, isoxazolyl, 1,2,4-triazinyl, and 1,3,5-triazinyl. Representative examples of bicyclic heteroaryl include, but are not limited to, benzimidazolyl, benzodioxolyl, benzofuranyl, benzooxadiazolyl, benzopyrazolyl, benzothiazolyl, benzothienyl, benzotriazolyl, benzoxadiazolyl, benzoxazolyl, chromenyl, imidazopyridine, imidazothiazolyl, indazolyl, indolyl, isobenzofuranyl, isoindolyl, isoquinolinyl, naphthyridinyl, purinyl, pyridoimidazolyl, pyrrolopyrrole, quinazolinyl, quinolinyl, quinoxalinyl, thiazolopyridinyl, thiazolopyrimidinyl, thienopyrrolyl, and thienothiophenyl. Representative examples of tricyclic heteroaryl include, but are not limited to, dibenzofuranyl and dibenzothienyl. The monocyclic, bicyclic, and tricyclic heteroaryls are connected to the parent molecular moiety through any carbon atom or any nitrogen atom contained within the rings.

As used herein, the term "heteroarylalkyl" refers to an alkyl group, as defined herein, in which at least one hydrogen atom is replaced with a heteroaryl group, as defined herein.

As used herein, the term "heteroarylene" refers to a divalent heteroaryl group.

As used herein, the term "hydroxy" means an —OH group.

As used herein, the term "substituent" refers to a group substituted on an atom of the indicated group. When a group or moiety can be substituted, the term "substituted" indicates that one or more (e.g., 1, 2, 3, 4, 5, or 6; in some embodiments 1, 2, or 3; and in other embodiments 1 or 2) hydrogens on the group indicated in the expression using "substituted" can be replaced with a selection of recited indicated groups or with a suitable group known to those of skill in the art (e.g., one or more of the groups recited below), provided that the designated atom's normal valence is not exceeded. Substituent groups include, but are not limited to, alkyl, alkenyl, alkynyl, alkoxy, acyl, amino, amido, amidino, aryl, azido, carbamoyl, carboxyl, carboxyl ester, cyano, cycloalkyl, cycloalkenyl, guanidino, halo, haloalkyl, haloalkoxy, heteroalkyl, heteroaryl, heterocyclyl, hydroxy, hydrazino, imino, oxo, nitro, phosphate, phosphonate, sulfonic acid, thiol, thione, or combinations thereof.

Certain compounds used to prepare materials disclosed herein may have at least one asymmetric center. Additional asymmetric centers may be present depending upon the nature of the various substituent groups. Compounds with asymmetric centers give rise to enantiomers (optical isomers), diastereomers (configurational isomers) or both, and it is intended that all of the possible enantiomers and diastereomers in mixtures and as pure or partially purified compounds are included within the scope of this disclosure. Pure enantiomers or diastereomers, or compositions of enantiomerically or diastereomerically enriched compounds, may be commercially available or may be synthesized by methods known in the art. The absolute stereochemistry of a compound may be determined by using X-ray crystallography to determine the crystal structure of crystalline products or crystalline intermediates that are derivatized, if necessary, with a reagent containing an asymmetric center of known absolute configuration. If desired, racemic mixtures of compounds may be separated so that the individual enantiomers are isolated. The separation can be carried out by methods well known in the art, such as the coupling of a racemic mixture of compounds to an enantiomerically pure compound to form a diastereomeric mixture, followed by separation of the individual diastereomers by standard methods, such as fractional crystallization or chromatography. The coupling reaction is often the formation of salts using an enantiomerically pure acid or base. The diastereomeric derivatives may then be converted to the pure enantiomers by cleavage of the added chiral residue. The racemic mixture of the compounds can also be separated directly by chromatographic methods using chiral stationary phases, which methods are well known in the art. Alternatively, any enantiomer of a compound may be obtained by stereoselective synthesis using optically pure starting materials or reagents of known configuration by methods well known in the art.

Materials used herein can also be prepared using isotopically-labeled compounds, which are identical to those compounds described herein but for the fact that one or more atoms are replaced by an atom having an atomic mass or mass number different from the atomic mass or mass number usually found in nature. Examples of isotopes suitable for inclusion in the compounds of the disclosure are hydrogen, carbon, nitrogen, oxygen, phosphorus, sulfur, fluorine, and chlorine, such as, but not limited to $^2$H, $^3$H, $^{13}$C, $^{14}$C, $^{15}$N, $^{18}$O, $^{31}$P, $^{35}$S, $^{18}$F, and $^{36}$Cl, respectively. Isotopically-labeled compounds may be commercially available or can be prepared by conventional techniques known to those skilled in the art or by processes analogous to those described herein, using an appropriate isotopically-labeled reagent in place of a non-isotopically-labeled reagent.

The use herein of the terms "including," "comprising," or "having," and variations thereof, is meant to encompass the elements listed thereafter and equivalents thereof as well as additional elements. As used herein, "and/or" refers to and encompasses any and all possible combinations of one or more of the associated listed items, as well as the lack of combinations where interpreted in the alternative ("or").

As used herein, the transitional phrase "consisting essentially of" (and grammatical variants) is to be interpreted as encompassing the recited materials or steps "and those that do not materially affect the basic and novel characteristic(s)" of the claimed invention. Thus, the term "consisting essentially of" as used herein should not be interpreted as equivalent to "comprising."

Moreover, the present disclosure also contemplates that in some embodiments, any feature or combination of features set forth herein can be excluded or omitted. To illustrate, if the specification states that a complex comprises components A, B and C, it is specifically intended that any of A, B or C, or a combination thereof, can be omitted and disclaimed singularly or in any combination.

Recitation of ranges of values herein are merely intended to serve as a shorthand method of referring individually to each separate value falling within the range, unless otherwise indicated herein, and each separate value is incorporated into the specification as if it were individually recited herein. For example, if a concentration range is stated as 1% to 50%, it is intended that values such as 2% to 40%, 10% to 30%, or 1% to 3%, etc., are expressly enumerated in this specification. These are only examples of what is specifically intended, and all possible combinations of numerical values between and including the lowest value and the highest value enumerated are to be considered to be expressly stated in this disclosure.

Glass is a physical state of matter in which the binarized distinction between solid and liquid appears to diminish. It is a metastable state characterized by the absence of the long-range atomic order typically found in crystalline solids, and it is often referred to as an amorphous solid. In theory, any crystalline material can be brought into a glassy state by kinetically suppressing its crystallization from the melted state. However, to sustain such an amorphous state (i.e., to avoid crystallization) for most materials under ambient conditions is quite challenging. This fact leads to a categorization of different materials as either glass formers or non-glass formers based on the ability of the melt to avoid crystallization and sustain a glassy state during cooling. This propensity to avoid crystallization in turn relies on numerous factors, such as the nature of chemical bonding within the solid, structural arrangement/rearrangement and density changes in the prospective crystalline and glass states, viscosity at the melting temperature and cooling rate employed.

Recently, phase change materials (PCM) have been used in the development of inorganic glasses. Some example applications for these materials include optical data storage discs (CD/DVD), random access memory (RAM), and solid state drives (SSD) in computing devices. Such devices are typically based on the switching characteristics of chalcogenide glasses, whereby the crystalline and amorphous states can be reversibly switched by exposure to different temperature cycles. The state change used to encode the data in the memory relies on the change of some easily measured semiconductor physical property in the amorphous (glass) and crystalline states. Examples include change in electrical resistivity, refractive index, and optical absorption. One pertinent problem in such systems is the large power requirement in changing the state of the system, due to the relatively high melting point (e.g., >600° C.) of the most commonly used Germanium-Antimony-Telluride (GST)-based PCM.

Low- to moderate-melting point (e.g., <~200° C.) semiconducting materials advantageously offer a cost-effective pathway to film deposition and fabrication (e.g., through melt processing into film or monolith form) and also provide a pathway to tune the material stoichiometry to better enable glass formation without inadvertent degradation. Hybrid materials such as metal-organic frameworks and associated primarily organic perovskite structures have been studied with regards to glass formation; however, due to the presence of principally organic components, the semiconducting properties have been largely limited for these systems.

In this regard, metal-halide-based perovskites offer high performance semiconducting character, coupled with generally low-temperature solution-based or vacuum-based processing. Germanium, tin, and lead-based metal-halide perovskites have been shown to melt at low temperature when combined with appropriately selected organic cations, and can be referred to as organic-inorganic perovskites. However, current metal-halide-based perovskites and corresponding organic-inorganic perovskites do not fall into the "glass-forming" category of materials and thus are not suitable for some applications, such as PCM-based computing devices.

To access the glassy state and achieve reversible crystal-glass switching in MHPs, three challenges must be met: a) a melting temperature ($T_m$) below the degradation/decomposition point ($T_d$), b) bulky molecular spacers and sufficiently high melt viscosity to frustrate the rapid reorganization of the melt into a crystalline structure during quenching, and c) an ability of the components to mobilize and recrystallize upon heating—i.e., the glass transition ($T_g$) and crystallization ($T_x$) temperatures must satisfy the relationship $T_g<T_x<T_m<T_d$.

The present disclosure provides a new class of metal-halide-based perovskites that can readily be switched between crystalline and glassy amorphous states. Referring to FIG. 1, the "parent" three-dimensional (3D) form of metal-halide-based perovskites, and more specifically, organic-inorganic perovskites, consists of an organic cation (R'—$NH_3$, where R' is a small organic moiety) that sits in the cubo-octahedral cavity made from inorganic metal halide octahedra that occupy the eight corners of the cube. When the size of the organic cation exceeds the size of the cubo-octahedral cavity, the 3D structure can convert into layers of inorganic metal halide octahedra that are templated by the larger organic cations (R—$NH_3$, where R is a larger organic moiety), which serve as molecular spacers between inorganic layers. Such structures are called two-dimensional (2D) perovskites and typically have a composition $A_2MX_4$ or $A'MX_4$, where A (R—$NH_3^+$) and A' ($^+H_3N$—$R^a$—$NH_3^+$) are appropriate organic cations, M is a divalent metal cation, and X is a halide anion. These 2D and 3D organic-inorganic hybrid materials have shown photovoltaic and luminescent properties along with the ability for a wide range of structural and property tunability. Due to the limited window of temperature difference between the degradation point ($T_d$) and melting point ($T_m$), the ability to control the melt processing of such materials while preserving the stoichiometry has been difficult. Conventional approaches to stabilize the amorphous state within this class of materials have typically been through application of pressure. Once the pressure is withdrawn, however, the system reverts to the parent crystalline form. Thus, the glass forming ability (GFA) of these materials is limited.

This is overcome with the presently disclosed class of 2D organic-inorganic metal halide semiconductors, wherein the family is defined by the selected group of organic cations incorporated into the structures. Certain organic cations can disrupt the hydrogen bonding between the ammonium group (from organic cation) and halides (from inorganic metal-halide octahedra), due to higher steric hindrance. The impeded hydrogen bonding is associated with a reduced melting temperature, $T_m$, such that $T_m$ is lower than the degradation point, $T_d$. Additionally, interactions among the organic cations (and hydrogen bonding between the organic and inorganic components) can be controlled such that the viscosity of the melt is increased and the ability of the structure to reorder upon quenching is hindered through the viscous forces, which enables maintaining the amorphous nature of the melt into the solid glass phase, given a sufficiently fast cooling rate.

Figures 2A, 2B, 2C, 2D, 2E, 2F:
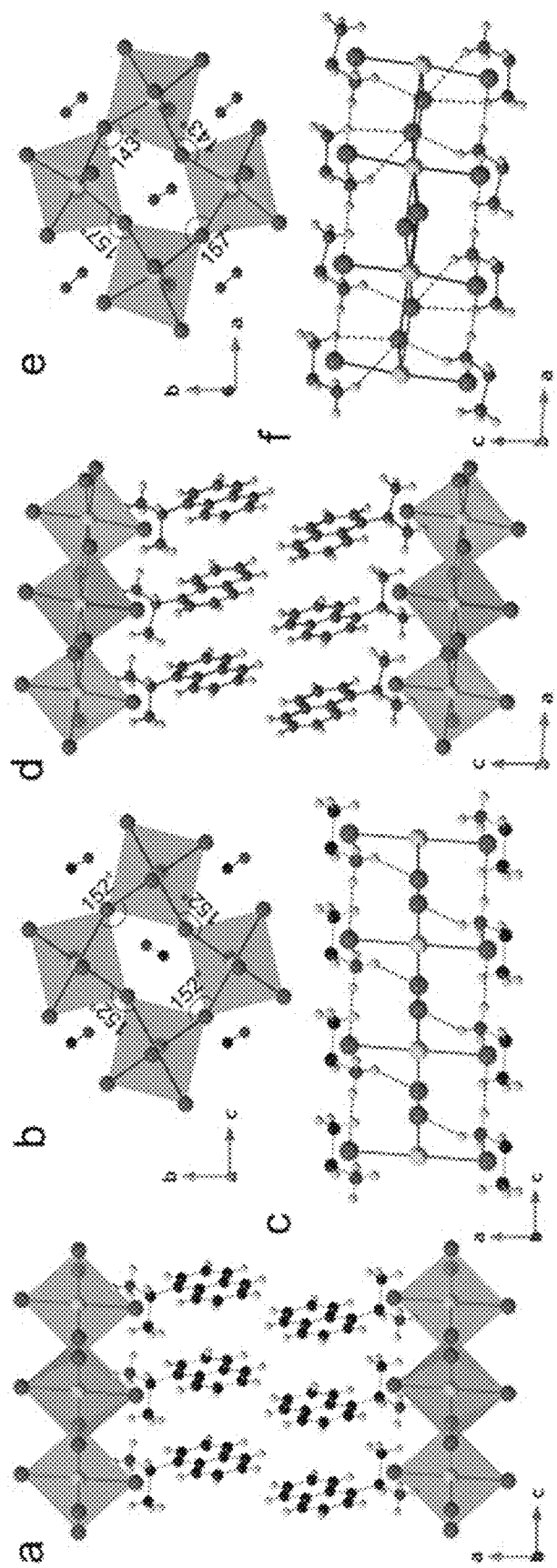
Figures 2G, 2H:
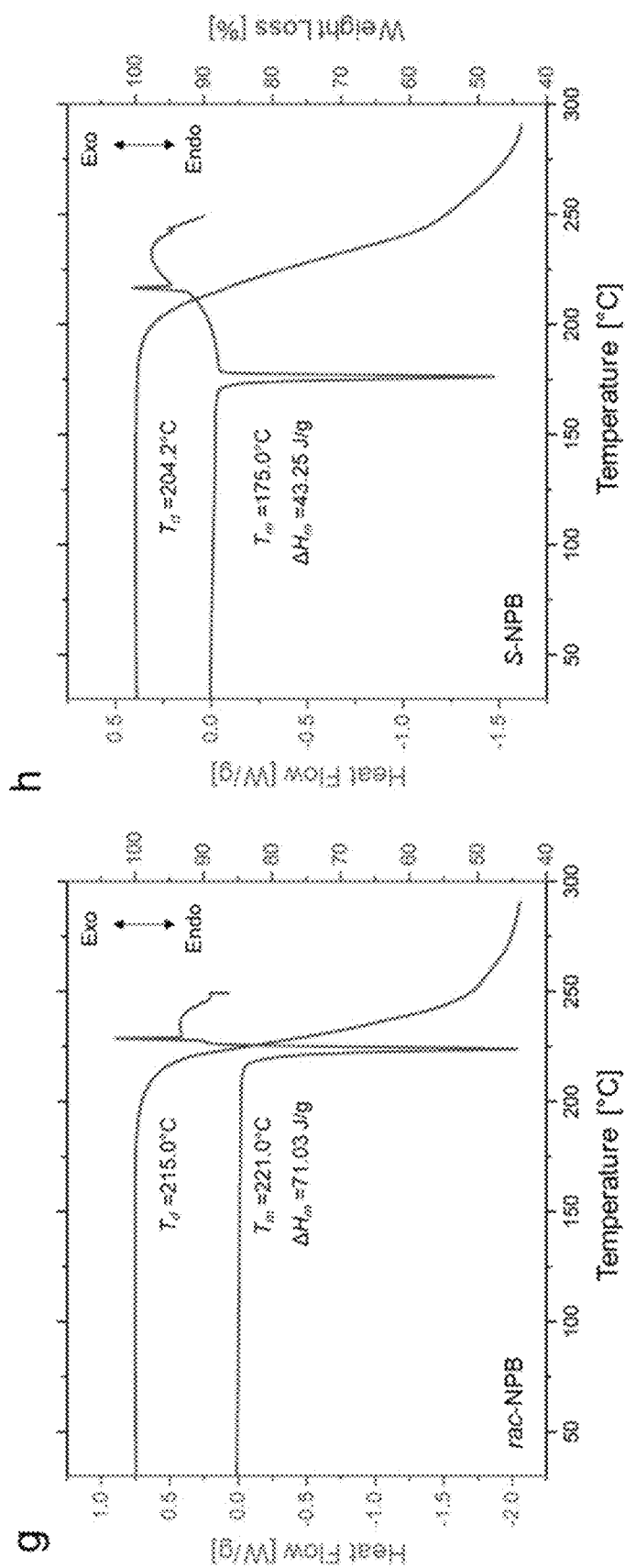
FIGS. 2G-2H show differential scanning calorimetry (DSC) and thermogravimetric analysis (TGA) showing thermal characteristics of $T_m$ (melting temperature), $T_d$ (degradation onset temperature), and $\Delta H_m$ (enthalpy of melting) of rac-NPB crystals (FIG. 2G) and S-NPB crystals (FIG. 2H). Rac-NPB crystals melt at a temperature approximately at or slightly exceeding the analogous degradation onset, whereas S-NPB shows suppressed melting temperature. Ramp rate used for thermal characteristics study is 5° C./min.
Figures 6A, 6B:
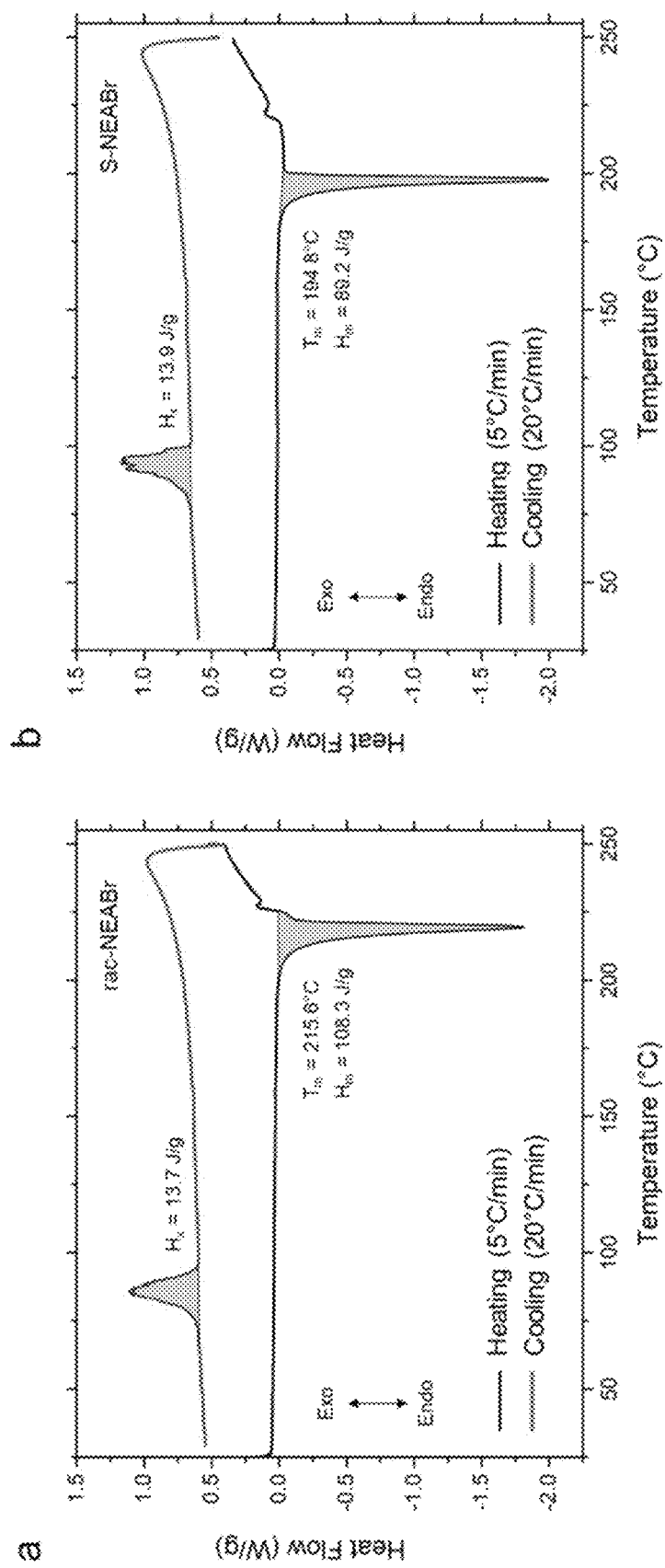
FIGS. 6A-6B show differential scanning calorimetry (DSC) data for racemic 1-(1-naphthyl)ethylammonium bromide (rac-NEABr) (FIG. 6A) and S-(−)-1-(1-naphthyl)ethylammonium bromide (S-NEABr) (FIG. 6B) salts with heating and cooling rates of 5° C./min and 20° C./min, respectively. The rac-NEABr salt melts at higher temperatures and higher enthalpy of melting compared to the chiral S-NEABr analog. Upon cooling at 20° C./min, both the salts show partial crystallization. It is likely that both samples experience some decomposition at temperatures above 225° C. prior to cooling.
Figure 7:
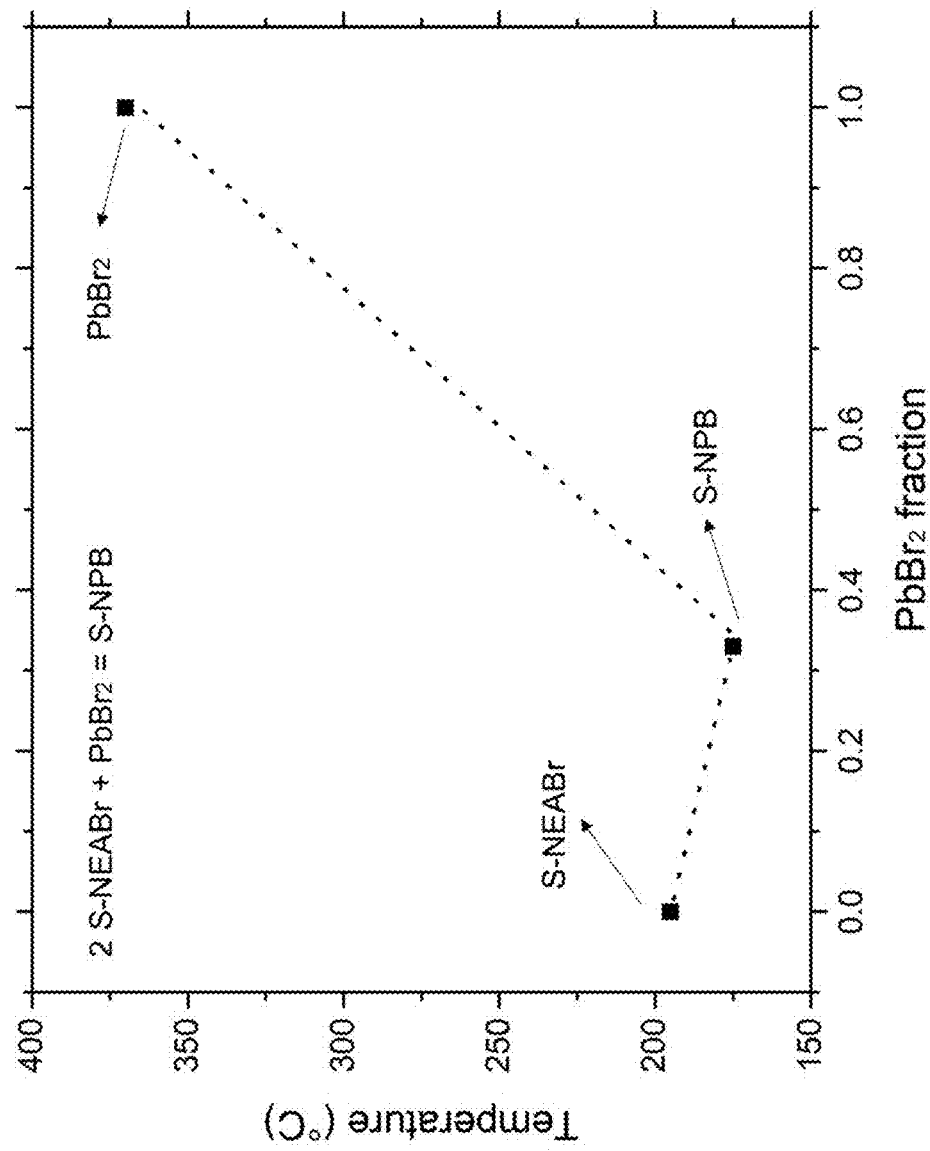
FIG. 7 shows evidence of eutectic-like behavior in the S-NEABr and $PbBr_2$ system. Organic (S-NEABr) and inorganic ($PbBr_2$) precursors show a higher melting point compared to the hybrid S-NPB (S-$NEA_2PbBr_4$) perovskite system.

Referring to FIGS. 2A-2F, crystal structures of an embodiment of an organic-inorganic metal halide semiconductor are shown. This example embodiment is chiral R-(+)- or S-(−)-1-(1-naphthyl)ethylammonium lead bromide (abbreviated as R-/S-NPB). As described in the Examples, single crystals of R- and S-NPB were synthesized by slowly cooling hot aqueous HBr solutions (e.g., ~95° C.) of lead bromide and R-(+)- or S-(−)-1-(1-naphthyl)ethylamine in stoichiometric quantities. Both S-NPB and rac-NPB crystallize in typical 2D MHP structures (FIGS. 2A and 2D), with however notably different hydrogen bonding and tethering group packing characteristics (FIGS. 2C and 2F). Recently, the distinct packing/hydrogen bonding and structural distortions in the lead bromide framework have been connected with asymmetry-induced Rashba-Dresselhaus spin-splitting in chiral NPB (Jana et al. *Nat. Commun.* 2020, 11, 4699). Differential scanning calorimetry (DSC) and thermogravimetric analysis (TGA) data for rac- and S-NPB (FIGS. 2G-2H) indicate that the different bonding characteristics also lead to a dramatically lower melting temperature for chiral S-NPB ($T_m$=175° C.) relative to rac-NPB ($T_m$=221° C.), as well as lower enthalpy of melting ($H_m$) of ~43 J/g for S-NPB versus ~71 J/g for rac-NPB. The organic salts, 1-(1-naphthyl)ethylammonium bromide (rac-NEABr) and S-(+)-(1-naphthyl)ethylammonium bromide (S-NEABr), themselves show disparate thermal characteristics (FIGS. 6A-6B), with S-NEABr showing lower $T_m$ and $H_m$ (~195° C. and ~89 J/g) relative to rac-NEABr (~215° C. and ~108 J/g). S-NEABr, when reacted with PbBr$_2$ ($T_m$~370° C.), forms S-NPB, which displays a eutectic-like lower $T_m$ (FIG. 7).

Figures 8A, 8B:
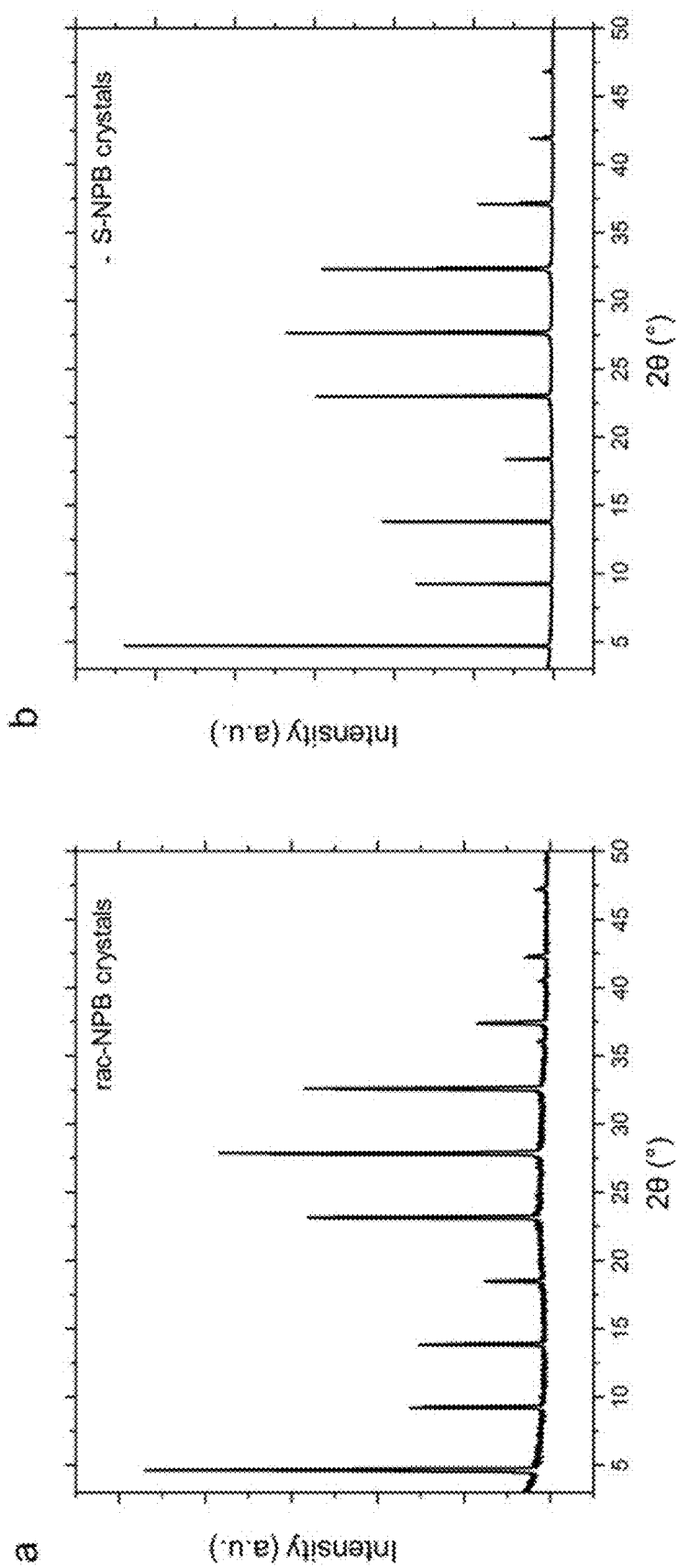
FIGS. 8A-8B show X-ray diffraction patterns of racemic-NPB (FIG. 8A) and chiral S-NPB (FIG. 8B) perovskite crystals.

Such disparate thermal behavior can be ascribed to structure-property characteristics of chiral- vs. racemic-NPB. Despite similar organic/inorganic components and powder XRD patterns (FIGS. 8A-8B), there are important differences in structural details between S- and rac-NPB. In S-NPB, individual PbBr$_6$ octahedra are severely distorted and exhibit asymmetric tilting distortions, leading to two disparate Pb—Br—Pb bond angles of 157° and 143° that correspond to two different types of in-plane Br atoms (FIG. 2E, Table 1). In contrast, PbBr$_6$ octahedra in rac-NPB are much less distorted and are symmetrically tilted, giving rise to a single in-plane Pb—Br—Pb angle of 152° (FIG. 2B, Table 1). In S-NPB, only one type of in-plane Br atom (i.e., associated with the 143° bond angle) exhibits significant hydrogen-bonding interactions with the organic cations (FIG. 2F). In contrast, in rac-NPB, every in-plane Br atom hydrogen bonds with the organic cations (FIG. 2C). The peculiar in-plane hydrogen-bonding found in S-NPB likely correlates with the specific configuration of organic tethering groups, which are arranged nearly parallel to one another within each organic layer (FIG. 2E), whereas in rac-NPB they arrange in a more typical crisscross fashion (FIG. 2B). The unique organic cation packing and hydrogen bonding, as well as associated lattice distortions, lead to suppressed melting temperature and crystallization kinetics in S-NPB relative to rac-NPB, as discussed below.

Figures 3A, 3B:
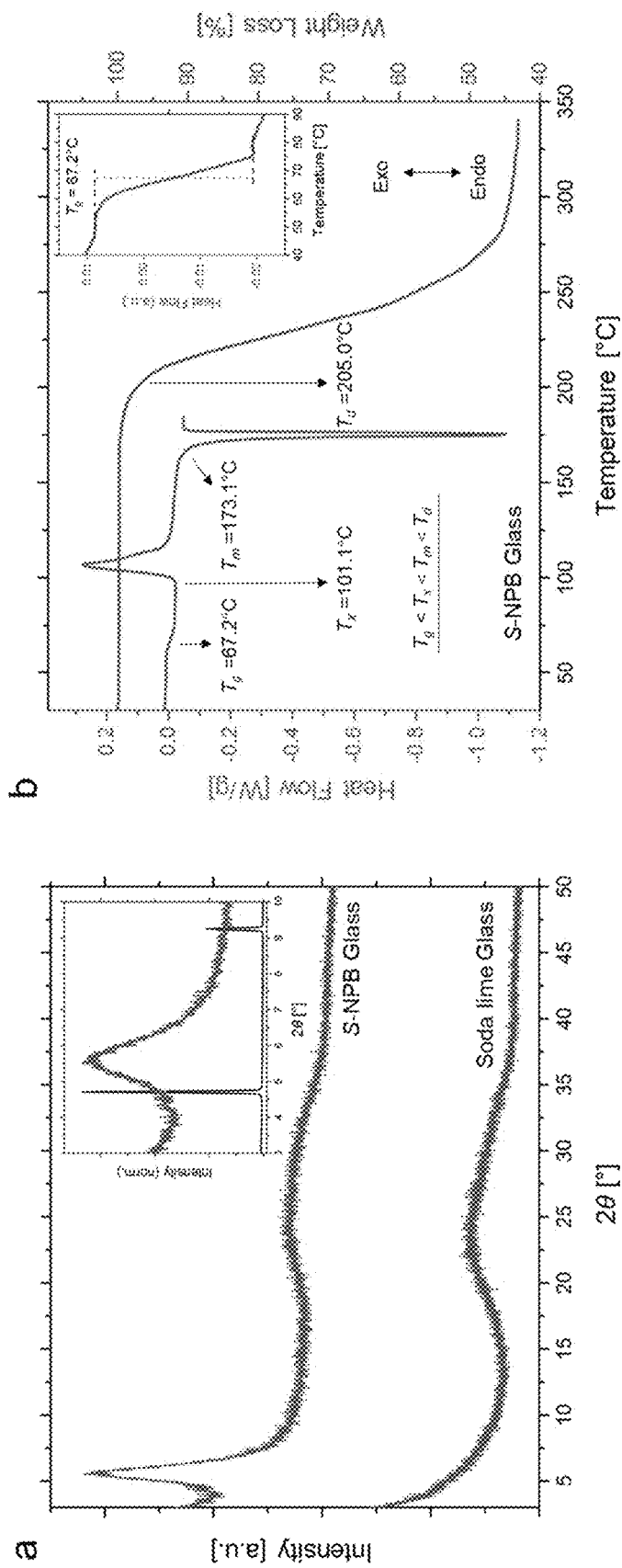
FIGS. 3A-3B show X-ray diffraction signatures and corresponding thermal characteristics of chiral perovskite glass.
Figure 9:
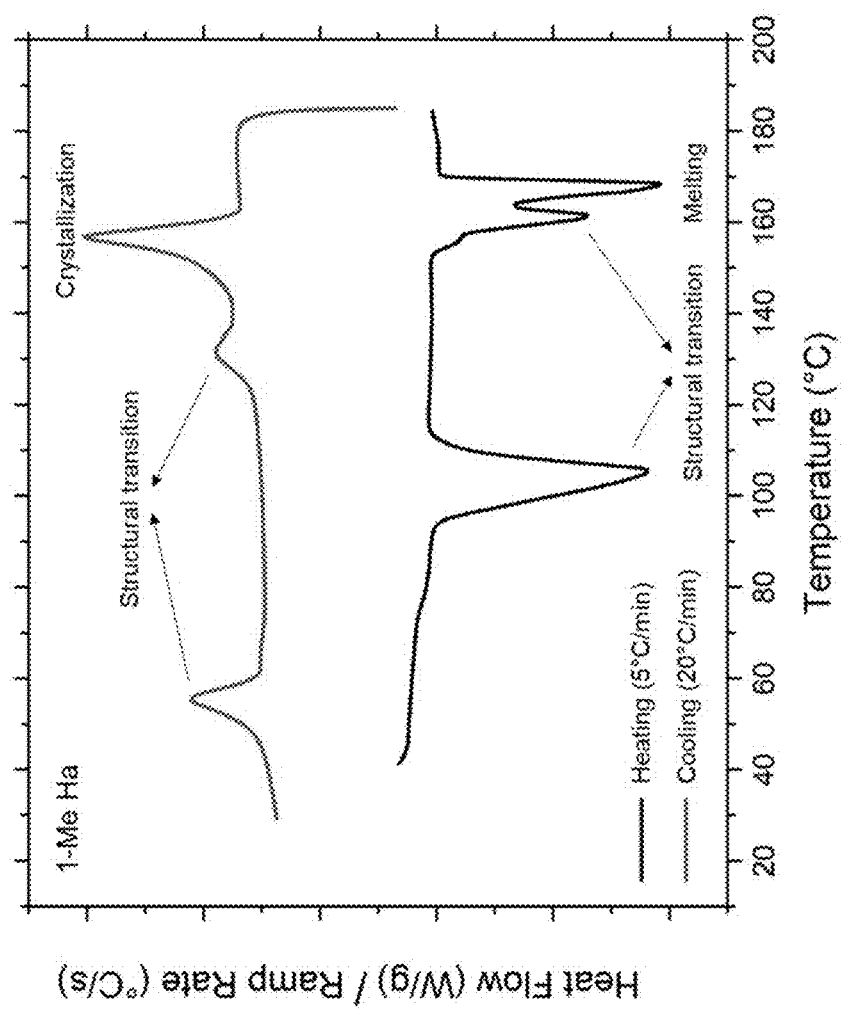
FIG. 9 shows DSC scans of (1-Me-ha)$_2$PbI$_4$ crystals. The black curve shows the two structural transitions before melting at ~170° C. in the heating cycle. Upon cooling (red curve), the melt quickly reorganizes to a crystalline state. Further cooling induces two hysteric structural transitions, as observed in the heating cycle.
Figures 10A, 10B:
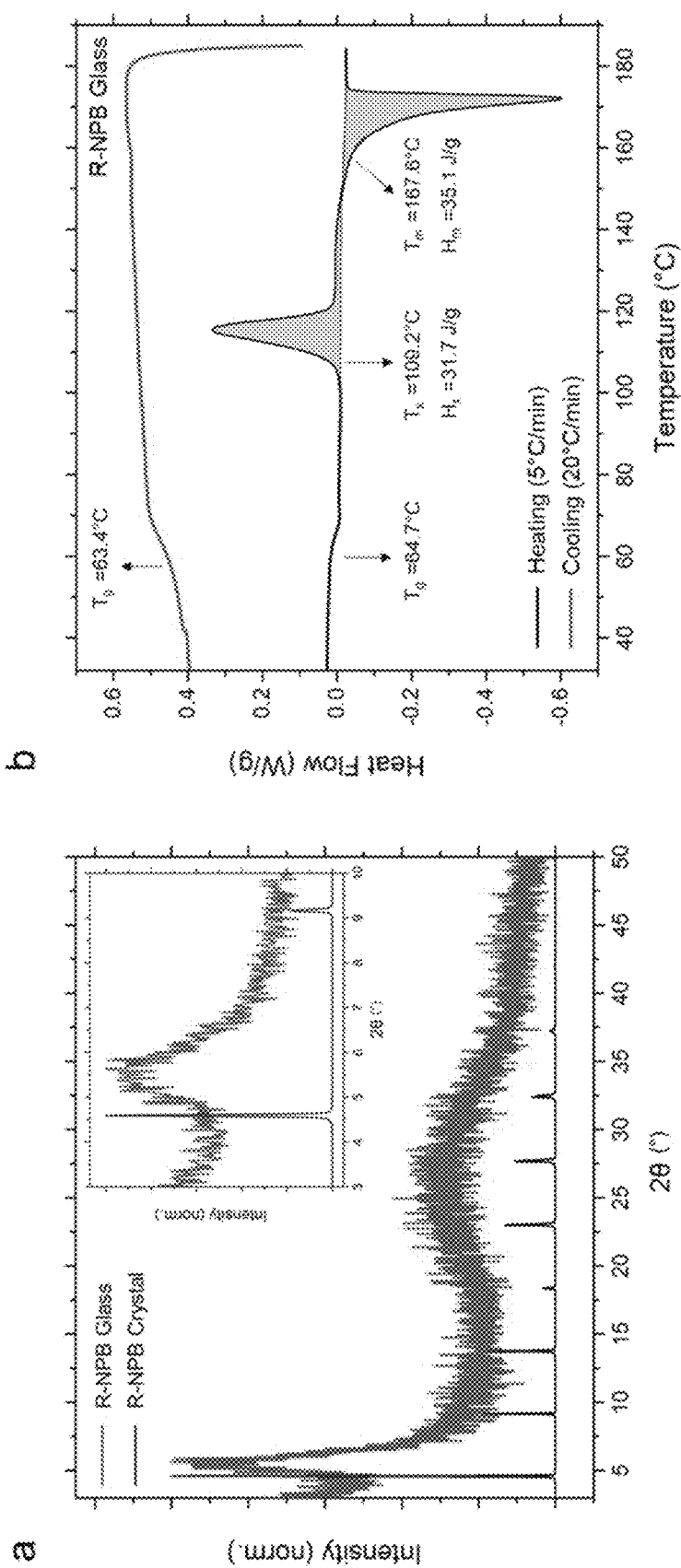
FIGS. 10A-10B show: (A) Normalized X-ray diffraction pattern of R-NPB glass showing a broad peak near $2\theta=5.6°$ (red), as opposed to the repeating family of peaks shown by R-NPB crystals (black). Inset shows the enlarged view in the lower $2\theta$ range to contrast the difference more clearly; (B) Heating and cooling DSC profile of R-NPB glass, revealing various characteristic temperatures such as $T_g$, $T_x$, and $T_m$, with all being relatively comparable to the S-NPB counterpart. Upon cooling at 20° C./min, the R-NPB melt converts into a glassy state, showing no evidence of crystallization.

Given the suppressed $T_m$, a uniform stoichiometric melt of S-NPB can be sustained without significant decomposition or loss of the organic component, which otherwise undergoes dissociation in rac-NPB due to a higher $T_m$, close to the decomposition point (a melt can nevertheless be maintained for short timeframes in rac-NPB). While several low-$T_m$ hybrid MHPs have been previously reported (S-NPB, however, offers the lowest $T_m$ for any reported lead-bromide-based MHP), all of these systems reportedly crystallize rapidly when cooled from the melt phase (e.g., FIG. 9) (Mitzi et al. *Adv. Mater.* 2002, 14, 1772; Mitzi et al. *Chem. Mater.* 2002, 14, 2839; Li et al. *Chem. Sci.* 2019, 10, 1168). In contrast, S-NPB forms a stable glass when quenched from the melt even at a modest cooling rate (see below regarding cooling rate), as evident from the XRD pattern (FIG. 3A). The bulky and relatively rigid aromatic rings, as well as the specific configurational requirements of ammonium tethering groups in S-NPB (FIG. 2E), slow down the ordering kinetics such that quenching the melt does not lead to instant crystallization, but instead to a glassy state. The XRD pattern of a melt-quenched S-NPB film reveals an amorphous feature centered at $2\theta \approx 5.6°$. The absence of a repeating family of distinct (00l) peaks, a typical feature of oriented crystalline 2D MHP films (inset of FIG. 3A), clearly reveals the lack of long-range atomic order in the quenched perovskite melts. The opposite enantiomeric form, R-NPB, also shows similar glassy characteristics upon melt-quenching (FIG. 10A) and similar characteristic transition temperatures (FIG. 10B).

Figures 11A, 11B:
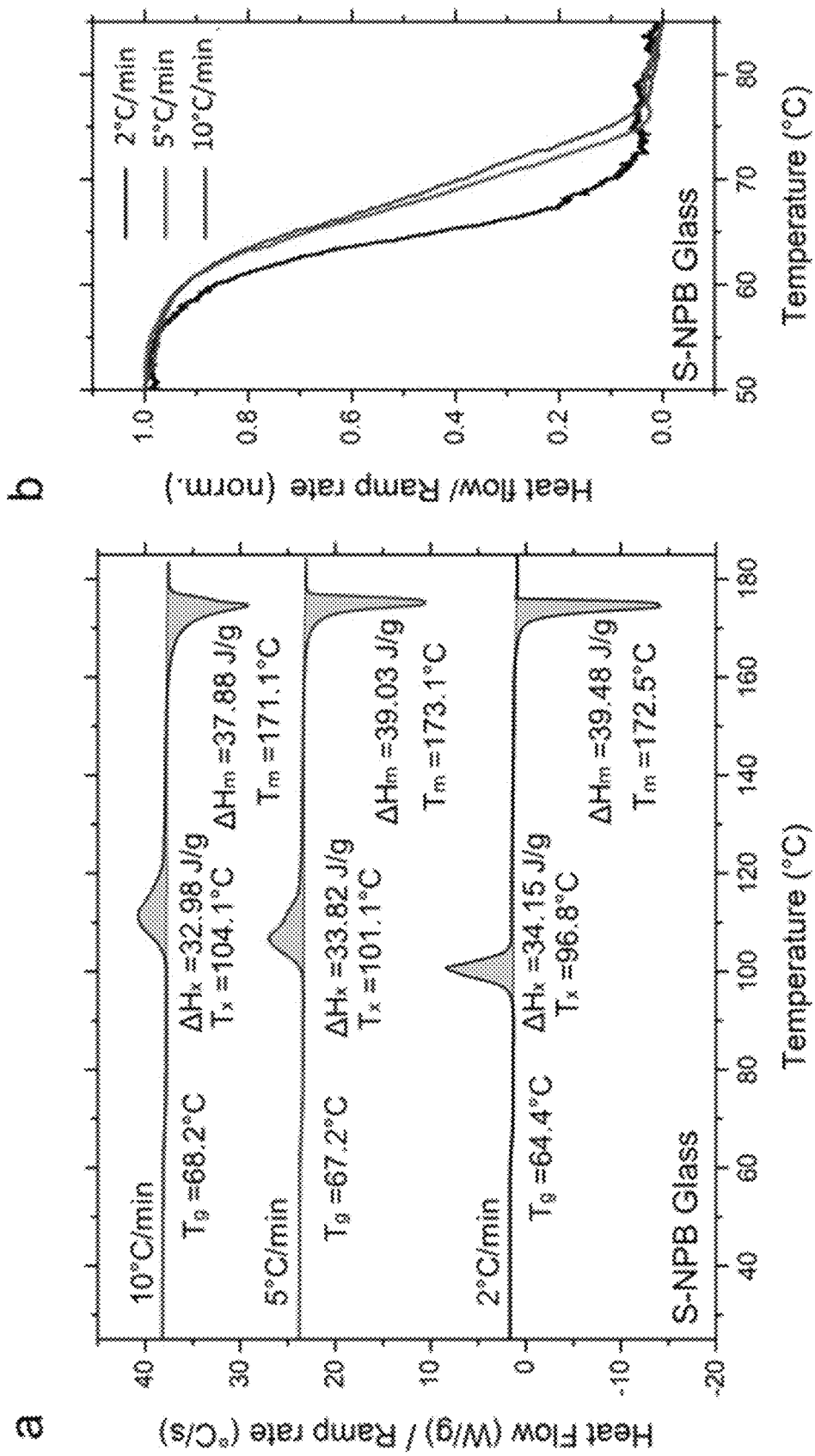
FIGS. 11A-11B show: (A) differential scanning calorimetry (DSC) of S-NPB glass at different heating rates, showing various temperature characteristics, such as $T_g$ (glass transition), $T_x$ (crystallization onset), $T_m$ (melting onset), $\Delta H_x$ (enthalpy of crystallization) and $\Delta H_m$ (enthalpy of melting); (B) glass transition temperature corresponding to different heating ramp rates.
Figure 12:
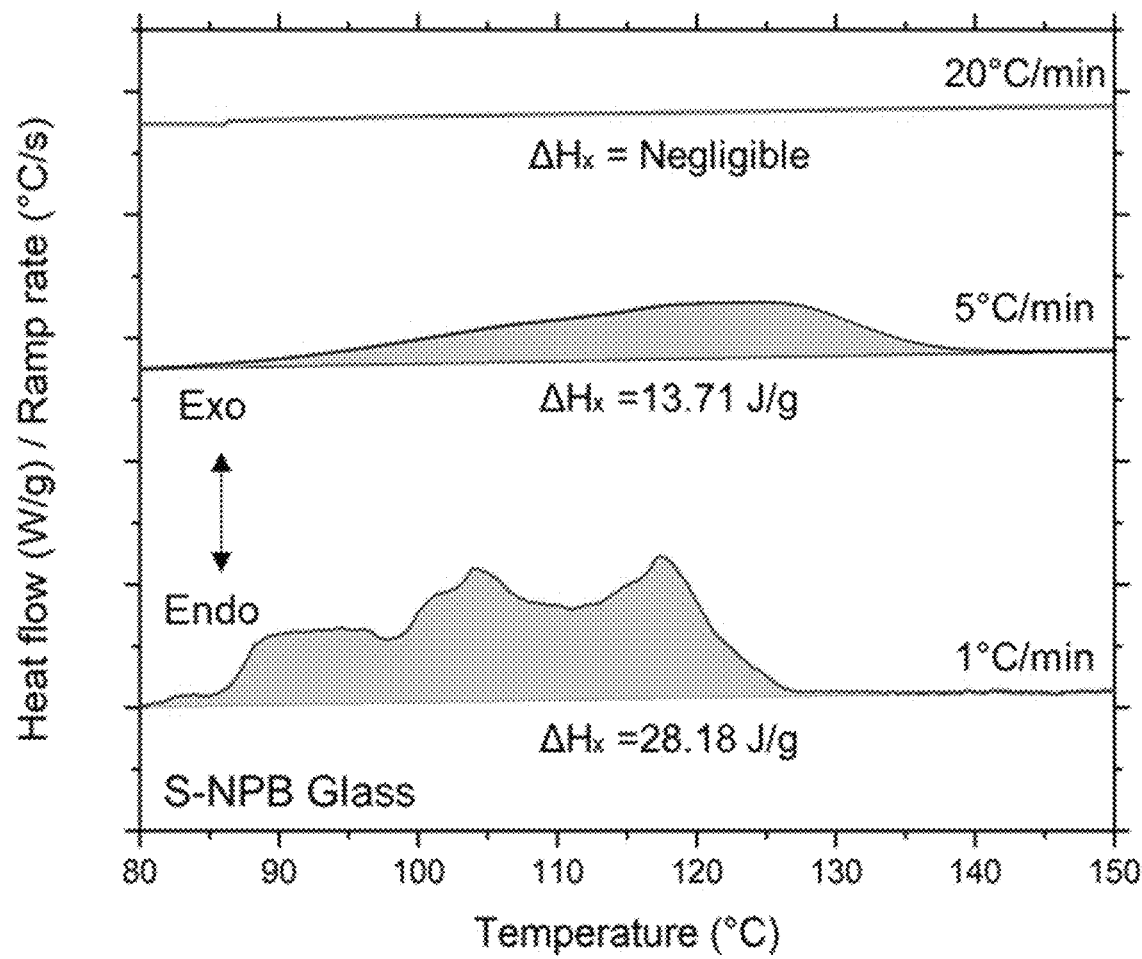
FIG. 12 shows DSC data for a S-NPB melt with various cooling rates. The cooling rate of 20° C./min shows negligible crystallization enthalpy, revealing complete glass formation.

A DSC heating cycle (FIG. 3B) for the melt-quenched glassy S-NPB reveals a clear glass transition at $T_g \approx 67°$ C. Upon acquiring enough thermal energy to induce structural relaxation beyond $T_g$, the glass begins to crystallize at $T_x \approx 101°$ C. and completes most of its transformation by ~118° C., as evidenced by the extended tail in the DSC curve. Further, the crystalline fraction begins to remelt at $T_m \approx 173°$ C. prior to its degradation/decomposition at $T_d \approx 205°$ C., corresponding to the onset of weight loss in the TGA curve. The $T_g$ and $T_x$ values reflect the kinetics of the underlying process, and both transitions shift towards higher temperatures with increasing ramp rates (FIGS. 11A-11B; Table 2). The characteristics of the glassy state can be further examined by evaluating the critical cooling rate—i.e., the minimum cooling rate sufficient to impede crystallization of the melt and enable glass formation. Measured crystallization enthalpies at different cooling rates (1, 5, and 20° C./min) demonstrate a negligible value for a cooling rate of 20° C./min (FIG. 12). Further, the Turnbull glass-forming ability criterium ($T_g/T_m>0.67$) is satisfied for the S-NPB glass with $T_g/T_m=0.76$, showing a strong propensity towards glass formation and supporting such a small critical cooling rate. This suggests a practical glass-forming region for the designed S-NPB perovskite, not only for thin-film configurations but also for bulk samples (e.g., monoliths or fibers).

Figure 13:
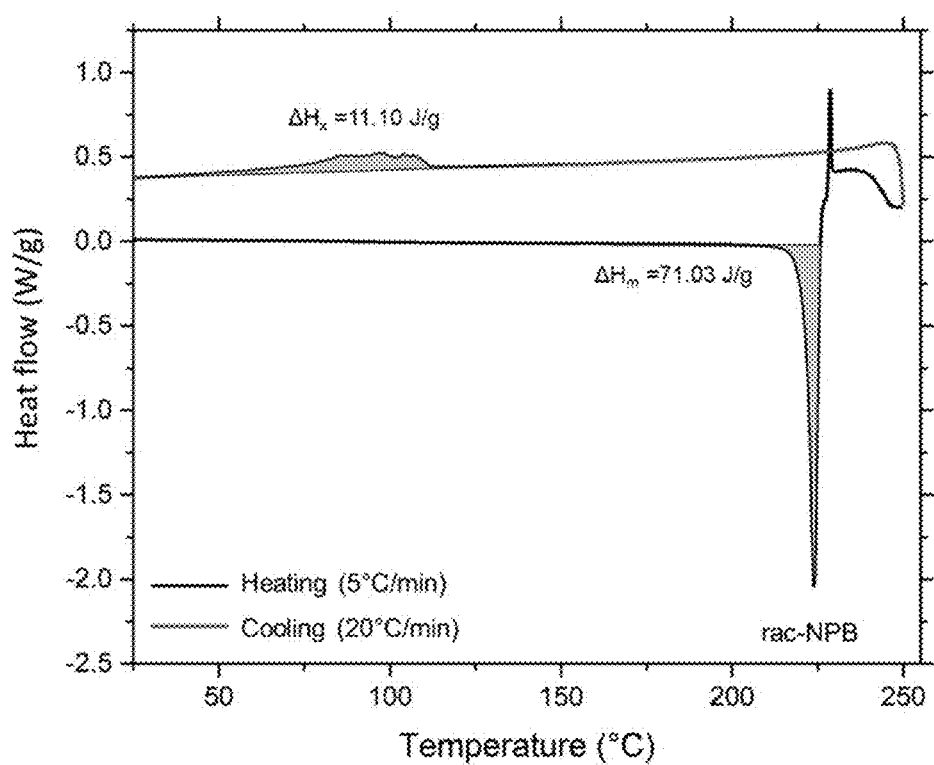
FIG. 13 shows a heating and cooling DSC profile of rac-NPB crystals, showing partial crystallization when the melt is cooled at 20° C./min. Partial decomposition is likely at temperatures above 225° C.
Figure 14:
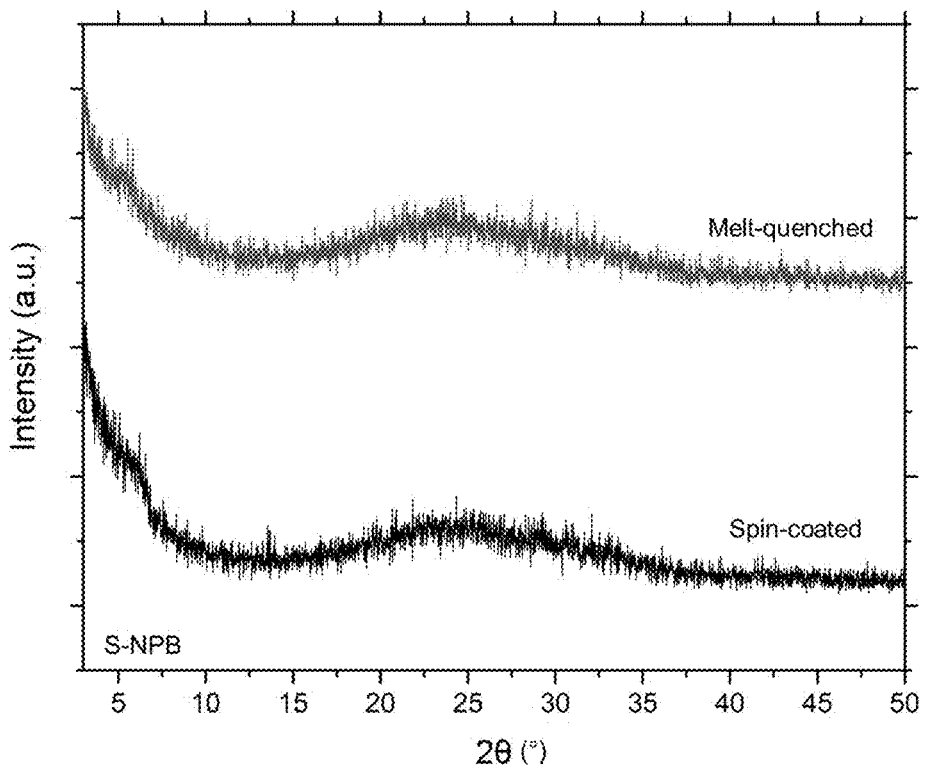
FIG. 14 shows an X-ray diffraction pattern of spin-coated S-NPB perovskite showing amorphous nature (black). Melt-quenching the spin-coated films (red) shows similar amorphous behavior, with no crystalline repeating peaks of layered perovskites.
Figure 15A:
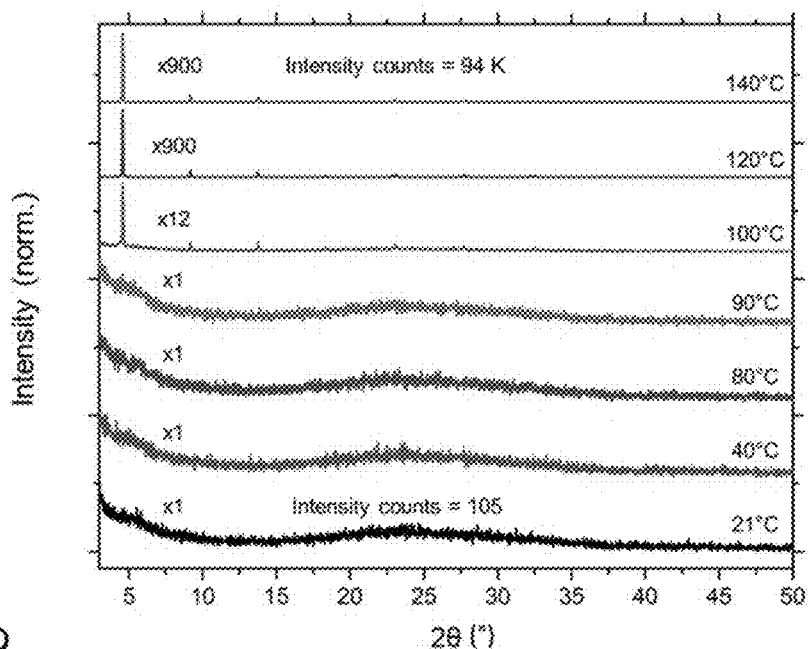
FIGS. 15A-15B show: (A) XRD analysis of melt-quenched film (black) obtained initially through spin coating of S-NPB solution, with subsequent annealing at various temperatures. Films annealed at temperatures exceeding 100° C. show significant crystalline attribute. (B) UV-Vis absorbance profile of the spin-coated (black), melt-quenched (red) and annealed (blue) films.
Figure 15B:
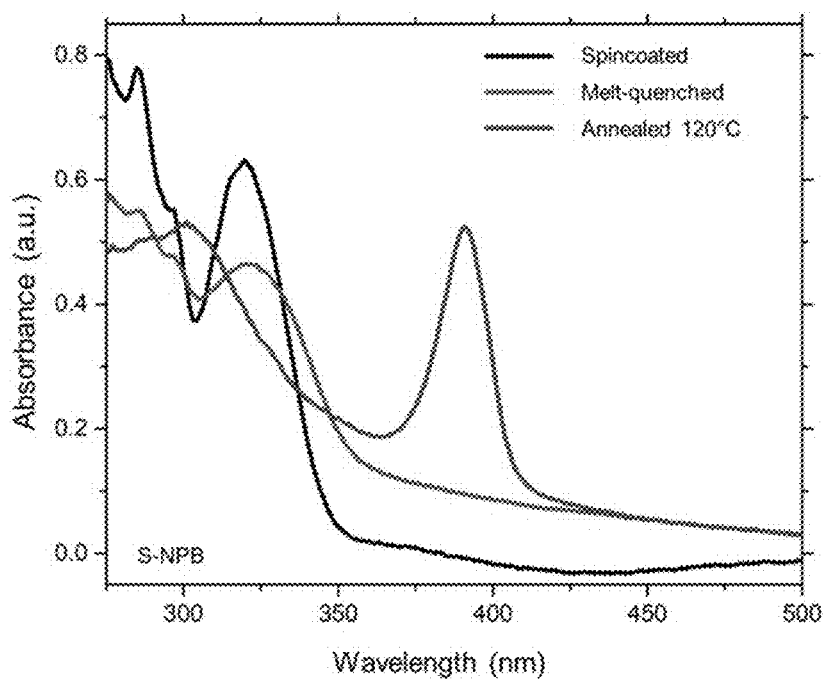
Figure 16:
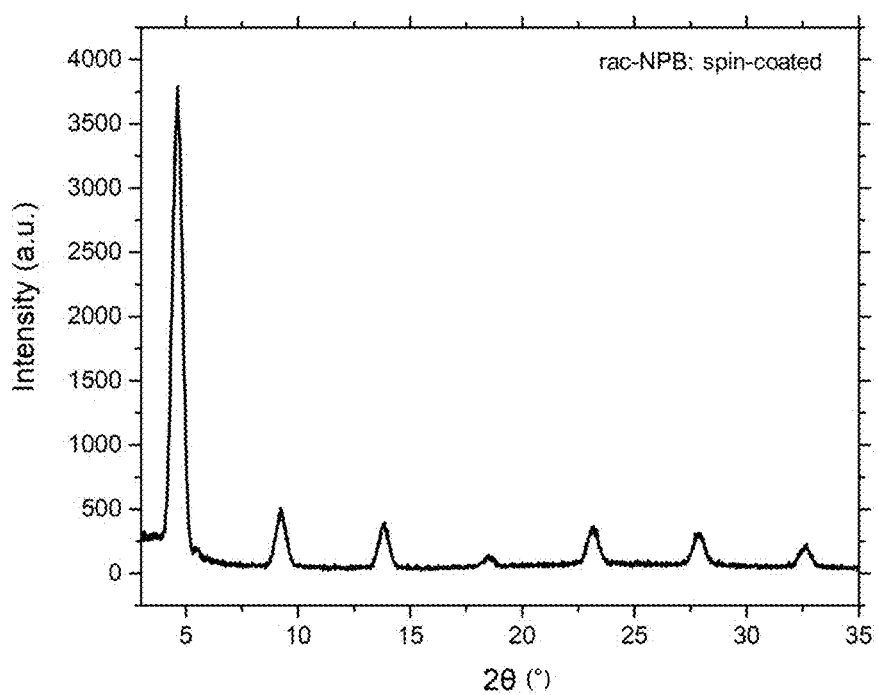
FIG. 16 shows an XRD pattern of spin-coated rac-NPB film showing repeating family of 2D perovskite peaks. These films show stronger propensity towards crystallization relative to chiral S-NPB films deposited under the same set of conditions.

Notably, under the same quenching rate of 20° C./min, rac-NPB does not transform into a complete glass, as evident by its crystallization enthalpy curve under the DSC cooling cycle (FIG. 13). We hypothesize that this may be due to the difference in molecular packing in rac-NPB relative to S-NPB. To test this idea, we compare solution-processed films of S-NPB and rac-NPB. When spin coating a solution of S-NPB crystals in dimethylformamide (DMF) onto a substrate, an amorphous thin film with no crystalline XRD peaks results (FIG. 14). We speculate that rapid drying of the DMF solution containing bulky and relatively rigid aromatic organics, coupled with the specific configurational requirements of the chiral organic cations, frustrates the hydrogen bonding in S-NPB, thereby restricting the reorganization and leading to an amorphous-like state. Upon annealing above $T_x$, crystalline XRD peaks begin to appear, along with a corresponding shift in optical absorption (FIGS. 15A-15B). We have similarly deposited films using DMF solutions of rac-NPB crystals, which exhibit broadened but crystalline XRD peaks in as-deposited films (FIG. 16), in contrast to the case for S-NPB.

Figures 4A, 4B, 4C, 4D:
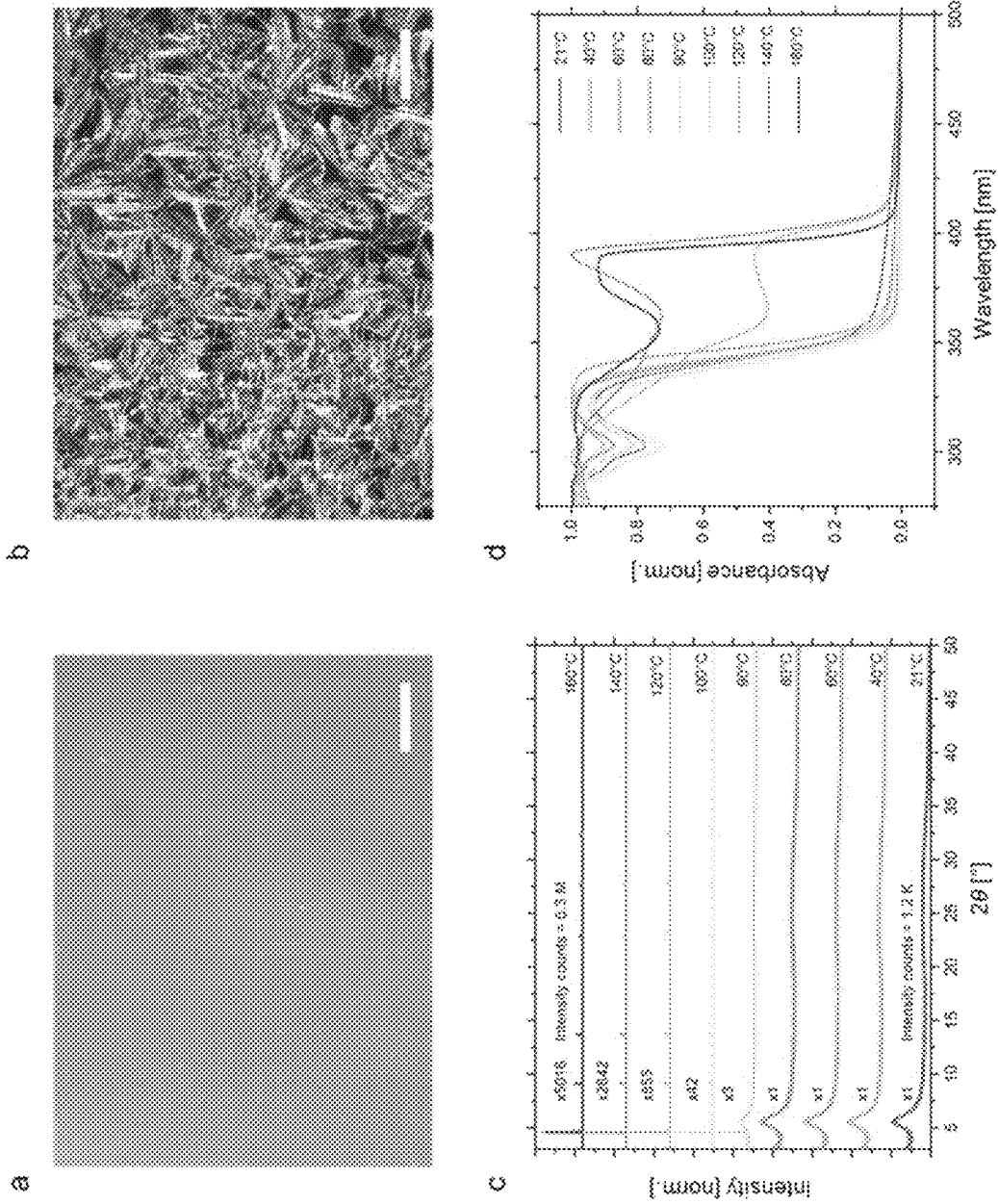
FIGS. 4A-4D show data for crystallization of chiral perovskite glass and corresponding change in optical property.
Figures 17A, 17B:
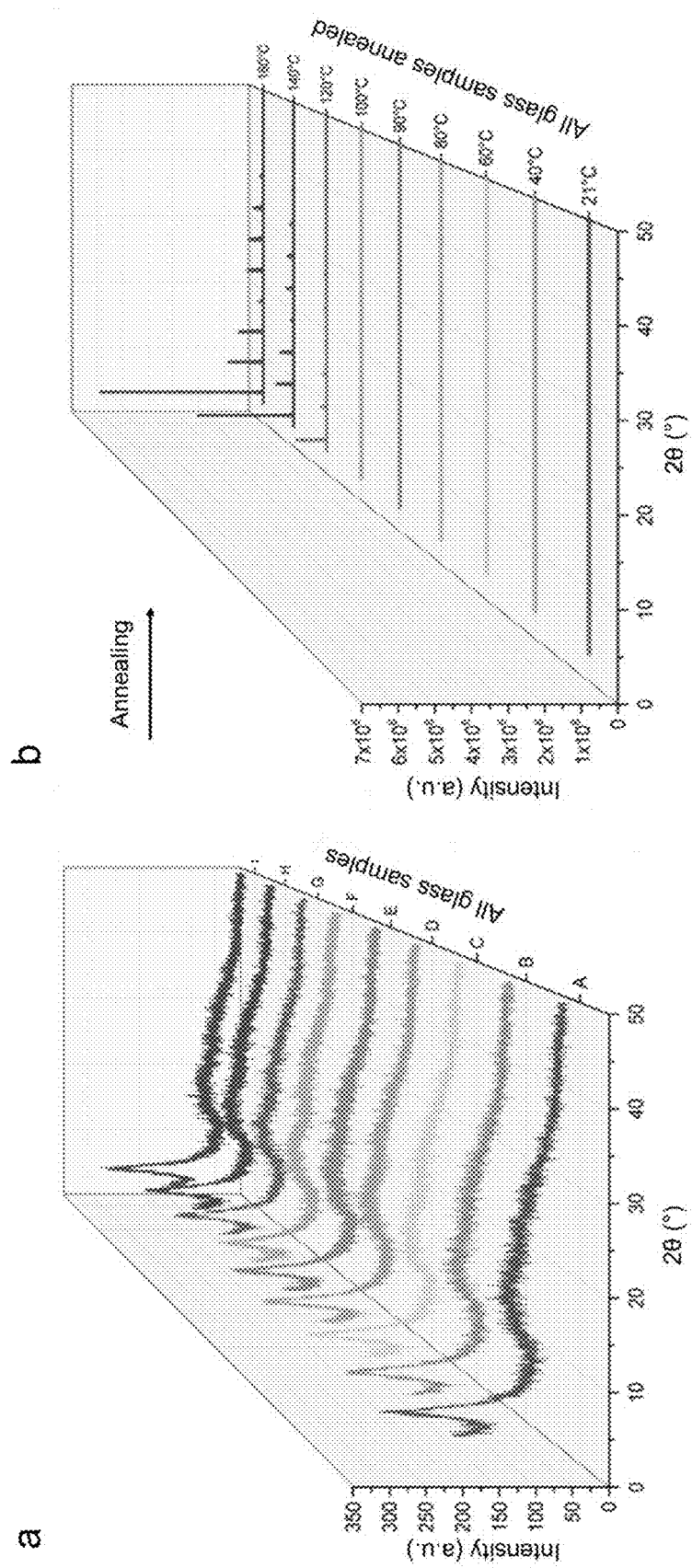
Figure 18:
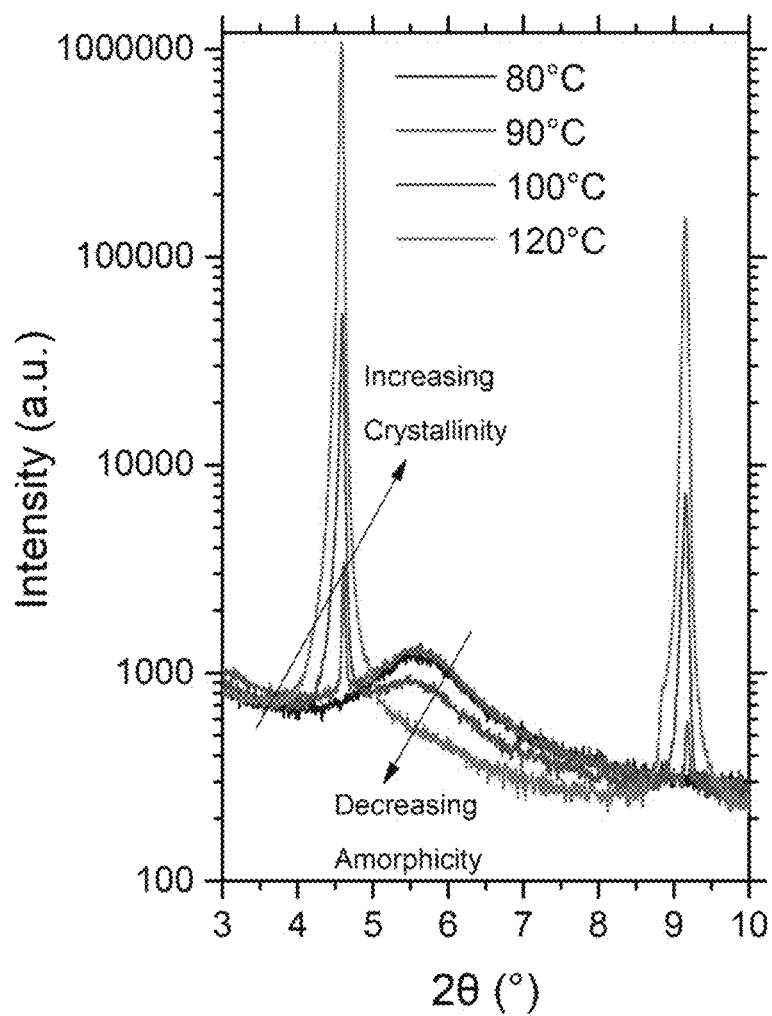
FIG. 18 shows log-scale X-ray diffraction patterns from several glassy-films each annealed at different temperatures for 5 min. As the annealing temperature increases from 80° C. to 100° C., the broad hump characteristic of the amorphous phase decreases in intensity while the crystalline peaks grow in intensity. At higher annealing temperatures of 120° C., the broad hump vanishes and the sample becomes highly crystalline with intense X-ray peaks.

As typical for an amorphous material, the morphology of the melt quenched glassy S-NPB film (FIG. 4A) shows a smooth surface, whereas microscopic crystals appear after annealing the glassy films beyond $T_x$ (FIG. 4B). To understand the crystallization and its influence on XRD pattern evolution and the corresponding change in optoelectronic properties, we prepared several films of S-NPB glass, which were then subjected to an anneal at different temperatures. The glassy/crystalline nature of such films was characterized before (FIG. 17A) and after (FIG. 17B) annealing for 5 minutes at the targeted temperature. XRD analysis of melt quenched and annealed S-NPB glassy samples (FIG. 4C) indicates crystallization onset in the 90-100° C. range (consistent with the DSC data), but with no appreciable change in the optical absorbance (FIG. 4D), suggesting a major fraction being still glassy. Only after annealing at ~120° C. do samples become substantially crystalline (FIG. 18), with higher XRD intensity count and with a significant shift in the absorption onset to longer wavelength (FIGS. 4C-4D). The sharp change in the absorption onset of the amorphous phase (358 nm) relative to the crystalline phase (405 nm) provides a wavelength difference of 47 nm that can be used as a physical response to differentiate between the two states in a prospective optical storage medium. Electronic properties are also expected to change drastically across the crystal-glass phase transformation.

Figure 5A:
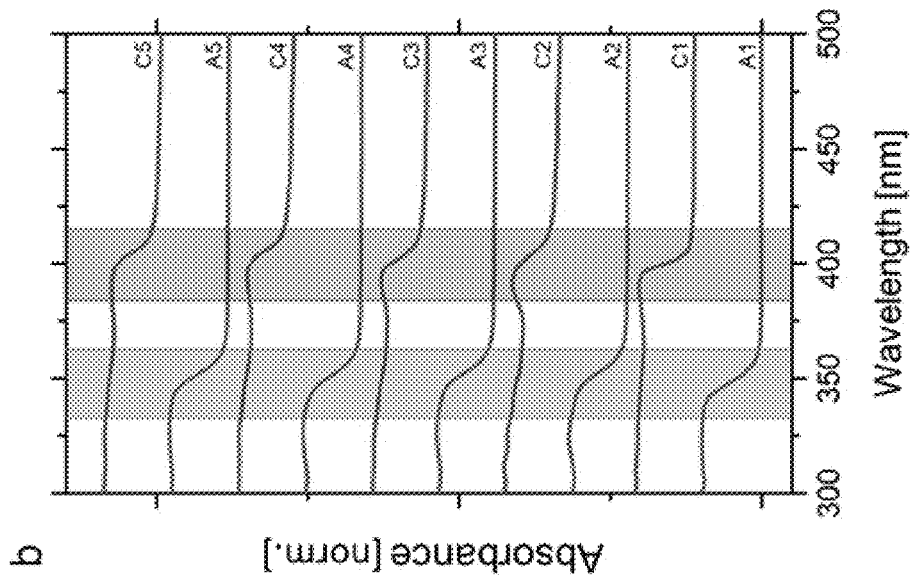
FIGS. 5A-5B show data demonstrating reversible switching between amorphous and crystalline states in S-NPB film.
Figure 5B:
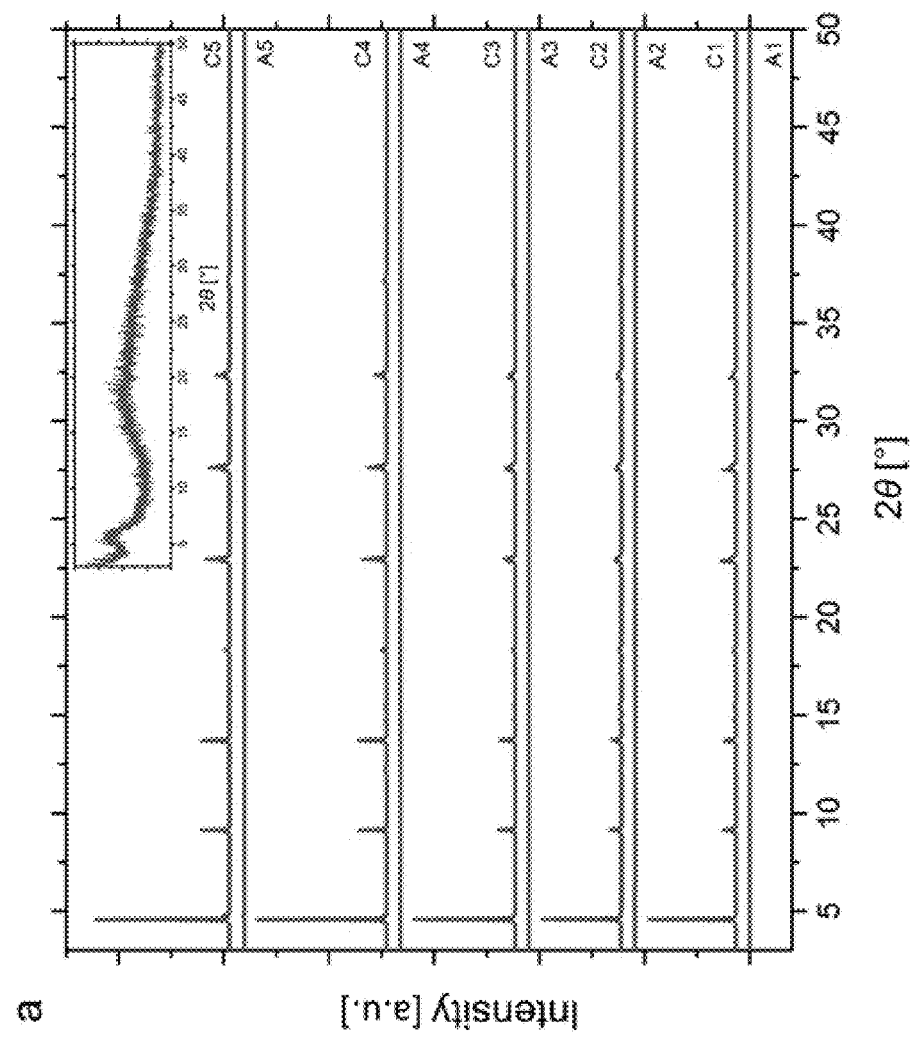

Such a change in physical properties prompted an examination of the reversible nature of the crystal-glass phase transition. To provide an initial examination of this point, we subjected a thin film to five different thermal cycles and recorded diffraction patterns (FIG. 5A) and optical absorption (FIG. 5B) profiles for each cycle. A broad feature (2θ≈5.6°) in the XRD measurements after every melt-quench amorphization cycle (A1-A5) reflects the glassy state, whereas subjecting the film to a moderate temperature (140° C.) switches it to the crystalline state (C1-C5), with a series of equidistant peaks corresponding to a layered perovskite. The optical absorbance shows a similar shift in absorption onset for the sample when exposed to similar thermal cycles (FIG. 5B), revealing the two different optical responses associated with the phase change. These preliminary results demonstrate the reversible nature of the crystalline-glass transformation exhibited by the 2D perovskite material.

Prospective application of MHP phase change materials will ultimately rely on several factors beyond the demonstration of a reversible glass-crystalline transition, including: 1) ability to broadly tailor the glass forming ability or Turnbull criterium (e.g., to allow for more rapid phase switching), 2) refinement of optical/electrical phase contrast between the glass and crystalline states for the particular application and 3) more rigorous testing of cyclability. In these regards, the highly versatile nature of the organic-inorganic hybrids—i.e., ability to select from an extensive range of commercially available or targeted synthetically modified organic cations—should allow for addressing these points. For instance, 1-methyl-hexylammonium lead iodide ((1-Me-ha)$_2$PbI$_4$), which employs a branched aliphatic organic cation, has recently been reported to melt at similar temperatures as S-NPB (~170° C.), but shows rapid crystallization under similar cooling conditions (FIG. 9). This example, as well as other known 2D MHPs that show low melting points ($T_m$<$T_d$) (Mitzi et al. *Adv. Mater.* 2002, 14, 1772; Mitzi et al. *Chem. Mater.* 2002, 14, 2839; Li et al. *Chem. Sci.* 2019, 10, 1168), could potentially be converted into a glassy phase provided the melt quenching rate is sufficiently high to drive the system out of thermodynamic equilibrium. These systems may be beneficial for phase-change memory and devices due to expected more rapid crystallization behavior imparted by the mobile and less bulky aliphatic cations during the cooling process. Further, introduction of targeted functionality from the organic cation (e.g., hydrophobicity, enhanced thermal stability, charge transfer properties or non-linear optical character) may facilitate tailoring of environmental stability, device endurance, as well as physical properties in glassy and crystalline states.

While the exemplary glass-forming organic-inorganic perovskite is demonstrated using (R)-(+)- and (S)-(-)-1-(1-naphthyl)ethylammonium lead bromide (R-/S-NPB) as an example, other embodiments are possible without departing from the scope of the disclosure. This property can carry over to other organic-inorganic hybrid materials with appropriately selected organic cations, such that the cations sterically or electronically interact with the inorganic layers in such a way that leads to a suppression of the hybrid melting temperature relative to the decomposition temperature, and with associated slowing in the kinetics of crystallization. For example, in some embodiments, the organic-inorganic hybrid material disclosed herein comprises an organic cation having a formula:

wherein R comprises a bulky organic group. In some embodiments R is an alkyl (e.g., $C_6$-$C_{14}$ alkyl), alkenyl (e.g., $C_6$-$C_{14}$ alkenyl), alkynyl (e.g., $C_6$-$C_{14}$ alkynyl), aryl, heteroaryl, arylalkyl, or heteroarylalkyl group. In some embodiments, R is an arylalkyl or heteroarylalkyl group. In some embodiments, R is an aryl-$C_1$-$C_4$-alkyl group. In some embodiments, the aryl group is selected from naphthyl, anthracenyl, and tetracenyl. In some embodiments, the aryl group is a naphthyl group. The aryl group of the arylalkyl moiety (e.g., the naphthyl group) can be optionally substituted with one or more suitable substituents, e.g., a substituent defined herein. In some embodiments, R is a heteroaryl-$C_1$-$C_4$-alkyl. In some embodiments, the heteroaryl group is a monocyclic, bicyclic, or tricyclic heteroaryl group. In some embodiments, the heteroaryl group is selected from pyrrole, thiophene, pyrrolopyrrole, thienothiophene, and acene-thiophene. The heteroaryl group of the heteroarylalkyl moiety can be optionally substituted with one or more suitable substituents, e.g., a substituent defined herein.

In some embodiments, the organic cation has a formula:

wherein: $R^1$ is a bicyclic, tricyclic or tetracyclic aryl, or a bicyclic, tricyclic, or tetracyclic heteroaryl; $R^2$ is hydrogen, $C_1$-$C_4$ alkyl, hydroxy, amino, or halo; m is 0, 1, 2, 3, or 4; and n is 0, 1, 2, 3, or 4. In some embodiments, n is 1 and $R^2$ is methyl, i.e. the organic cation has formula (I):

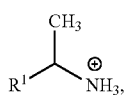

(I)

wherein $R^1$ is aryl or heteroaryl. In some embodiments, le is a bicyclic aryl or a bicyclic heteroaryl. As one skilled in the art will appreciate, the compound of formula (I) has a chiral carbon atom. Although a racemic mixture can be used, in particular embodiments, the compound of formula (I) is a single enantiomer, i.e., either the (R)- or (S)-enantiomer.

In some embodiments, R is a 1-naphthylethyl group. In some embodiments, R is a (S)-(−)-1-(1-naphthyl)ethyl group. In some embodiments, R is a (R)-(+)-1-(1-naphthyl) ethyl group. In some embodiments, the organic cation comprises multiple charged groups. For example, in some embodiments, the organic cation has formula:

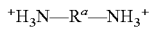

wherein $R^a$ is a divalent linking group comprising an alkyl, alkenyl, alkynyl, aryl, or heteroaryl group, or any combination thereof.

Further, the metal halide framework can readily be changed. Generally, the metal ion of the metal halide, M, should exist in a divalent oxidation state and be of a suitable size to adopt an octahedral coordination and fit within the perovskite structure. A non-limiting list of suitable M ions that are relevant for incorporation into switchable organic-inorganic perovskites includes: $Pb^{2+}$, $Sn^{2+}$, $Ge^{2+}$, $Cu^{2+}$, $Cr^{2+}$, $Ni^{2+}$, $Co^{2+}$, $Fe^{2+}$, $M''^{2+}$, $V^{2+}$, $Pd^{2+}$, $Cd^{2+}$, $Pt^{2+}$, $Rh^{2+}$, $Eu^{2+}$, $Yb^{2+}$, $Sm^{2+}$. In some embodiments, M is selected from $Pb^{2+}$, $Sn^{2+}$, $Ge^{2+}$, $Cu^{2+}$, $Cr^{2+}$, $Ni^{2+}$, $Co^{2+}$, $Fe^{2+}$, $Mn^{2+}$, $V^{2+}$, $Pd^{2+}$, $Cd^{2+}$, $Pt^{2+}$, $Eu^{2+}$, $Yb^{2+}$, and $Sm^{2+}$. In some embodiments, M is selected from $Pb^{2+}$, $Sn^{2+}$, and $Ge^{2+}$. In some embodiments, M is $Pb^{2+}$. The choice of metal cation will impact the properties and uses of the organic-inorganic perovskite (both in the glassy and crystalline states). For example, when magnetic ions are used (e.g., $Cu^{2+}$), the resulting organic-inorganic perovskite can exhibit magnetic properties, whereas when $Ge^{2+}$, $Sn^{2+}$, or $Pb^{2+}$ are used, the perovskite is generally a semiconductor. Additionally, the halide of the metal halide, X, can be selected from among halogen anions, most notably $X=F^-$, $Cl^-$, $Br^-$ and $I^-$. In some embodiments, X is $F^-$. In some embodiments, X is $Cl^-$. In some embodiments, X is $Br^-$. In some embodiments, X is $I^-$. In the case of semiconducting halide perovskites, the choice of halogen generally impacts the bandgap of the semiconductor.

In some embodiments, the metal halide perovskite is a double perovskite, such as those described in Vargas et al. *ACS Energy Lett.* 2020, 5(11) 3591-3608. Exemplary double perovskite materials include those having formula $A_2M^1M^2X_6$, where A (R—$NH_3^+$) is an appropriate organic cation, $M^1$ is a monovalent metal cation, $M^2$ is a trivalent metal cation, and X is a halide anion. In such embodiments, the organic cations can be any of the organic cations described herein. In some embodiments, $M^1$ is a monovalent metal cation selected from $Ag^+$, $Cu^+$, and $Au^+$. In some embodiments, $M^2$ is a trivalent metal cation selected from $Au^{3+}$, $Bi^{3+}$, $Sb^{3+}$, $In^{3+}$, and $Tl^{3+}$.

As discussed above, in some embodiments, the hybrid material has the following characteristic temperature relationship: $T_g<T_x<T_m<T_d$, where $T_g$ is glass transition temperature, $T_x$ is crystallization onset temperature, $T_m$ is melting onset temperature, and $T_d$ is degradation onset temperature. In some embodiments, switching between states is accompanied by a measurable change in an observable property, and wherein the observable property optionally comprises optical absorption, reflectivity, refractive index, magnetic state, and/or electrical conductivity. One skilled in the art is aware of methods by which to detect such changes.

The hybrid material can be provided in any desired form for the application of interest, e.g., as a film, a sheet, a fiber, and/or a thick section. The hybrid material can be provided as a film supported on a substrate, such as a substrate comprising silicon, silicon dioxide, quartz, glass, plastic, metal (e.g., metal foil), or any combination thereof. The substrate can, in some embodiments, have a melting temperature that is higher than the melting temperature of the hybrid material.

The present disclosure also provides methods for producing a switchable organic-inorganic hybrid material in a glassy amorphous state. For example, such materials can be prepared using steps of: preparing a solution of a metal halide and an organic cation in a solvent (e.g., by dissolving the metal halide and the organic cation or a precursor thereof in the solvent); depositing the solution onto a substrate; and evaporating the solvent to produce a film and impede the crystallization of the hybrid material. The metal halide and the organic cation can be any of those described herein, such as those described above. The solvent can be any suitable solvent for dissolving the metal halide and the organic cation, such as water, acetone, methanol, ethanol, propanol, isopropanol, ethylene glycol, acetonitrile, acetic acid, pyridine, chloroform, hydrazine, amines, dimethylformamide (DMF), dimethyl sulfoxide (DMSO), N-methyl-2-pyrrolidone (NMP), gamma-butyrolactone (GBL), or any combination thereof. The evaporating step rapidly dries the material, and can be conducted using methods such as high-speed spin-coating, slit-casting and air knife blading, or ink jet printing. The rapid drying can be achieved in a range of about 0.001 to about 30 seconds (or any subrange therein), such that dynamics of crystallization for the switchable organic-inorganic hybrid are impeded.

The disclosure also provides a process to prepare stable glass of a switchable organic-inorganic hybrid material described herein, comprising: melting single crystals, powdered crystals and/or polycrystalline films of the hybrid material, and cooling at a rate in the range of 1 K/min to $10^{10}$ K/min (or any subrange therein) such that the kinetics of crystallization are impeded. The melt can be held at a sufficient length of time to ensure formation of a uniform melt without degradation (e.g., about 30 seconds to about 2 minutes, or any range therebetween). Pressure can be used to constrain the melt (e.g., between layers of substrate), so as to produce a laminated glassy amorphous film upon cooling. A substrate can be removed after melt formation to produce a glassy amorphous film on only one surface upon cooling.

The switchable organic-inorganic metal halide materials not only open a wide range of possible applications other than PCM, but also provide a pathway to achieve applications with lower power requirement. In particular, the power requirement in reverting to an amorphous, or "reset," state for chalcogenide-glass-based PCMs can drastically be reduced upon using metal-halide-based glasses. The disclosure herein not only demonstrates such a low melting temperature semiconductor that forms a stable glass, but also shows the switching ability between different states required in a non-volatile PCM device that can require significantly less power and can be cost-effective in terms of synthesis and deposition towards fabrication of devices. Such materials may be useful for numerous applications, such as low-power memory and computing devices, photovoltaic devices, photodetectors, light emitting diodes, or other optical devices.

In summary, the present disclosure offers critical design criteria for realizing stable (at ambient pressure) and switchable glassy state within hybrid perovskites. In addition to the favorable bulky organic spacers, the unique packing and hydrogen bonding characteristics in chiral- vs. racemic-NPB lead to striking differences in the thermodynamics of melting and crystallization, thus favoring a facile glass formation in chiral-NPB, unlike racemic-NPB. The exceptionally low $T_g$, $T_x$, and $T_m$ of chiral NPB favor moderate operational conditions and a low thermal budget for glass-formation and phase-switching, in contrast with commercialized chalcogenide glasses, while a relatively higher value of $T_g/T_m$ (Turnbull criterium) reflects a greater propensity for glass-formation. Demonstration of a readily-processed hybrid semiconductor glass that offers low power (low temperature) phase switching between crystalline and amorphous states, coupled with access to the extensive flexibility of organic chemistry to tailor the organic cation, offers a new set of application prospects for the MHP family, including phase-change memory, non-linear optics, communication and advanced computing. Particular applications include optical fibers, switchable metamaterials, energy storage materials, and passivating layers for solar cells.

Additional details regarding the materials disclosed herein and the experiments described below can be found in Singh et al. *Adv. Mater.* 33 (2021): 2005868, which is incorporated herein by reference in its entirety.

EXAMPLES

Chemicals: (S)-(−)-1-(1-naphthyl)ethylamine (>99%, Sigma-Aldrich), (R)-(+)-1-(1-naphthyl)ethylamine (>99%, Sigma-Aldrich), 1-(1-naphthyl)ethylamine (98%, Sigma-Aldrich), 2-aminoheptane (1-Me-ha, 99%, Sigma-Aldrich), lead bromide ($PbBr_2$, 99.99%, TCI chemicals), hydroiodic acid (HI) solution (57 wt %, stabilized, 99.95%, Sigma-Aldrich) and hydrobromic acid (HBr) (48 wt % in $H_2O$, >99.99%, Sigma-Aldrich) were procured and used without further purification.

Single crystal synthesis: To grow (S)-(−)-1-(1-naphthyl) ethylammonium lead bromide (S-NPB) perovskite crystals, stoichiometric amounts of $PbBr_2$ (90 mg, 0.24 mmol) and (S)-(−)-1-(1-naphthyl)ethylamine (78 µl, 0.48 mmol) were dissolved in aq. HBr (1.0 ml) and deionized water (2.4 ml) in a sealed vial at 95° C. The hot solution was slowly cooled to room temperature (21° C.) over a period of 24 hours in a water bath, resulting in the formation of colorless plate-like S-NPB single crystals. The (R)-(+)-1-(1-naphthyl)ethylammonium lead bromide (R-NPB) crystals were grown using the same recipe used for S-NPB, with (R)-(+)-1-(1-naphthyl)ethylamine substituted as the ammonium group precursor. To grow 1-(1-naphthyl)ethylammonium lead bromide (rac-NPB) perovskite crystals, stoichiometric amounts of $PbBr_2$ (90 mg, 0.24 mmol) and 1-(1-naphthyl)ethylamine (78 µl, 0.48 mmol) were dissolved in aq. HBr (1.0 ml) and methanol (2.4 ml) in a sealed vial at 95° C. The hot solution was slowly cooled to room temperature (21° C.) over a period of 24 hours in a water bath, resulting in the formation of layered flakes of transparent rac-NPB single crystals. The as-obtained crystals of S-NPB, R-NPB and rac-NPB were filtered, washed with diethyl ether, and heated at 90° C. for 5 minutes before final vacuum drying. Crystals of 1-methyl-hexylammonium lead iodide were prepared by mixing stoichiometric amounts of $PbI_2$ (55.3 mg, 0.12 mmol) and 2-aminoheptane (36.1 µl, 0.24 mmol) in hydroiodic acid (HI, 1 ml) solution in a sealed vial at 95° C. The hot solution was then slowly cooled to room temperature (21° C.) over a period of 24 hours in a water bath, resulting in the formation of yellowish (1-Me-ha)$_2$PbI$_4$ perovskite crystals.

Synthesis of S, R, and rac-NEABr salts: To a solution of S/R/rac-1-(1-naphthyl)ethylamine (0.5-1 ml) in methanol (3 ml), equimolar (with respect to amine) aq. HBr was added dropwise under stirring. This clear solution was kept on a hot plate at 90° C. and pumped under vacuum overnight to evaporate the solvent. The off-white precipitates thus formed were collected, washed with ether, and dried under vacuum.

Melt processing for glassy film formation: Soda lime glass substrates (25.4×10.0×1.2 mm$^3$) were cleaned by ultrasonication in isopropanol and deionized water for 10 minutes each. Upon air drying the substrates, all were subjected to Ar—$O_2$ plasma treatment for 10 minutes. A few single crystals (<1.0 mg) of S-NPB/R-NPB perovskite were placed on a soda lime glass substrate. Crystals were then covered with an 8-µm-thick Kapton sheet and placed onto a preheated hot plate set to 190° C. (15° C. in excess of the melting point in order to reduce viscosity and facilitate spreading); the structure was pressed on top with another preheated soda lime glass substrate to spread the melt. After visual inspection to insure melting (~60 seconds), the overlying glass substrate was removed and the thin-film melt, sandwiched between the underlying glass substrate and overlying Kapton, was left to heat for another 30 seconds before quickly placing on a metallic steel bench to rapidly cool to room temperature for glass formation. Annealing-assisted crystallization of glassy thin-film samples was performed on a hotplate at different temperatures ranging from 21° C. to 160° C. for 5 minutes each after removal of the Kapton sheet.

For UV-Vis optical absorbance measurement, the S-NPB glass is prepared using the above procedure, but without the intervening Kapton sheet, and the glassy film remains sandwiched between two transparent soda lime glass substrates for the measurement (i.e., the top glass substrate is not removed at the end of the process).

Solution processing for glassy film formation: A solution (0.2 M) of S-NPB or rac-NPB crystals in DMF was spin-coated on pre-cleaned soda-lime glass substrates (10.0 mm×10.0 mm×1.2 mm) at a spin speed of 3000 rpm for 30 seconds inside a N2-filled glovebox. Once brought outside the glovebox, individual S-NPB films were subjected to different annealing temperatures for 5 minutes on a hotplate. Melting of these spin-coated films was carried out under Kapton and overlaying preheated soda lime glass substrate, as mentioned in the previous section.

Phase reversibility testing: To study the reversibility of the crystalline-amorphous transition, melt-processed glassy S-NPB thin-film samples were subjected to 5 amorphization/crystallization thermal cycles. Crystallization was carried out by treating the glassy films at 140° C. for 5 minutes and amorphization was carried out by remelting the thin films at 190° C. for 90 seconds, with quick cooling on a steel bench (at ambient temperature) while the S-NPB is sandwiched between a Kapton sheet and soda lime glass substrate. Experimental data were acquired prior to subsequent thermal cycles to show the reversibility in their properties. All processing was carried out under ambient atmospheric conditions.

Thermogravimetric (TGA) analysis: Thermogravimetric analysis (TGA) measurements were performed on a TA Q50 instrument using a 5° C./min ramping rate from 25 to 300° C. under nitrogen gas flow (40 ml/min) with samples (~4.5 mg) of single crystals of S-NPB and rac-NPB perovskite. Glassy S-NPB perovskite sample (3.9 mg) for TGA measurement was prepared by scratching off the melt-quenched glass prepared on soda lime glass substrates.

Differential Scanning calorimetry (DSC): Differential scanning calorimetry (DSC) measurements were performed using a TA Discovery DSC instrument using various ramping rates and temperature ranges (as described in the main text) using a hermetically sealed aluminum pan and lid. Prior to experiments, the DSC setup was calibrated with metallic indium (melting temperature: 156.6° C.; enthalpy of melting: 28.71 J/g), which upon repeating the experiment showed an acceptable temperature offset of 0.2° C. and melting enthalpy offset of 0.04%. Calibration and the above measurement were carried out at a ramp rate of 5° C./min. DSC analysis of crystalline S-NPB and rac-NPB perovskites were carried out by hermetically sealing corresponding crystals (~5.0 mg) in aluminum pan/lid, and ramping temperature from 25° C. to 250° C. at a ramp rate of 5° C./min. DSC analysis of crystalline organic salts (S-NEABr and rac-NEABr) sample (~4.0 mg) was carried out in a similar manner. For measurement of S-NPB and R-NPB glasses, samples were prepared by melting S-/R-NPB crystals (~5.0 mg) in an open aluminum pan and quickly placing it on a metallic steel bench to quench to room temperature. After hermetic sealing, the glassy samples were exposed to a heating cycle with ramp rates of 2, 5 and 10° C./min over a temperature range from 25° C. to 185° C. and heated isothermally at 185° C. for a minute, before cooling back to room temperature at ramp rates of 1, 5 and 20° C./min. Since the glass transition occurs over a temperature range, the glass transition temperature, $T_g$, was determined using the midpoint half-height method (https://www.mt.com/us/en/home/supportive_content/matchar_apps/MatChar_HB401.html). The crystallization ($T_x$), melting ($T_m$), and degradation ($T_d$) temperatures were calculated using the intersection between the corresponding DSC peak onset with its horizontal baseline. For $T_m$, the onset temperature signifies the melting temperature of the sample under consideration, whereas the peak temperature corresponds to complete melting of the sample inside the apparatus (https://www.perkinelmer.com/CMSResources/Images/44-74542GDE_DSCBeginnersGuide.pdf; Höhne et al. Thermochim. Acta 1990, 160, 1). (Table 2). The enthalpy of crystallization and melting were calculated by measuring the area under curve of heat flow (W/g)/ramp rate (° C./s) and temperature.

X-ray diffraction (XRD): The X-ray diffraction (XRD) measurements of bare crystals and thin films were performed on a PANalytical Empyrean Powder X-ray diffractometer using Cu Kα radiation, with the X-ray tube operating at 45 kV and 40 mA. Measurements were carried out over the 2θ range of 3° to 70° for the crystallization study, whereas a smaller 2θ range of 3° to 50° was employed for the reversibility study of crystalline-glassy state switching.

Optical absorbance: Optical absorption measurements were performed on a Shimadzu UV-3600 spectrophotometer using a sampling interval of 1 nm. The absorption onset for various films was calculated using the intersection between the onset of the UV-Vis absorbance curve and the associated horizontal baseline.

Morphology study: The optical microscope images for the glassy and crystalline S-NPB films were obtained using a Carl Zeiss Stemi 305.

TABLE 1

Computed distortion parameters from single-crystal structures of rac/S/R-NPB[a,b] (Jana et at. Nat Commun 11, 4699 (2020)).

| Compound | $\sigma^2$ (°)$^2$ | $\Delta d$ (10$^{-4}$) | Axial Br-Pb-Br bond angle (°) | Bridging Pb-Br-Pb bond angle(s) (°) |
|---|---|---|---|---|
| rac-NPB | 19.8 | 3.1 | 180 | 152 |
| S- and R-NPB | 40.26 | 6 | 166 | 143, 157 |

[a]Bond length distortion, $\Delta d = \left(\frac{1}{6}\right)\Sigma(d_i - d)^2/d^2$ where $d_i$ denotes the six Pb-Br bond lengths and d is the mean Pb-Br bond length.
[b]Bond angle variance, $\sigma^2 = \Sigma_{i=1}^{12}(\theta_i - 90)^2/11$ where $\theta_i$ denotes the individual cis Pb-Br-Pb bond angles.

TABLE 2

Various temperature characteristics of glassy and crystalline S-NPB perovskite as measured through DSC under different temperature ramp rates.

| Glass | $T_g$ (° C.) | $T_x$ (° C.) 'onset' | $T_x$ (° C.) 'peak' | $\Delta H_x$ (J/g) | $T_m$ (° C.) 'onset' | $T_m$ (° C.) 'peak' | $\Delta H_m$ (J/g) |
|---|---|---|---|---|---|---|---|
| 10° C./min | 68.2 | 104.1 | 111.3 | 32.98 | 171.1 | 174.7 | 37.88 |
| 5° C./min | 67.2 | 101.1 | 106.7 | 33.82 | 173.1 | 175.4 | 39.03 |
| 2° C./min | 64.4 | 96.8 | 100.7 | 34.15 | 172.5 | 174.5 | 39.48 |
| Crystal (5° C./min) | — | — | — | — | 175.0 | 177.4 | 43.25 |

One skilled in the art will readily appreciate that the present disclosure is well adapted to carry out the objects and obtain the ends and advantages mentioned, as well as those inherent therein. The present disclosure described herein are presently representative of preferred embodiments, are exemplary, and are not intended as limitations on the scope of the present disclosure. Changes therein and other uses will occur to those skilled in the art which are encompassed within the spirit of the present disclosure as defined by the scope of the claims.

No admission is made that any reference, including any non-patent or patent document cited in this specification, constitutes prior art. In particular, it will be understood that, unless otherwise stated, reference to any document herein does not constitute an admission that any of these documents forms part of the common general knowledge in the art in the United States or in any other country. Any discussion of the references states what their authors assert, and the applicant reserves the right to challenge the accuracy and pertinence of any of the documents cited herein. All references cited herein are fully incorporated by reference, unless explicitly indicated otherwise. The present disclosure shall control in the event there are any disparities between any definitions and/or description found in the cited references.

The invention claimed is:
1. An organic-inorganic hybrid material, comprising:
a metal halide anionic framework; and
one or more organic cations,
wherein the hybrid material is reversibly switchable between glass and crystalline states.

2. The hybrid material of claim 1, comprising alternating layers of metal halide anion layers and organic cation layers.

3. The hybrid material of claim 1, wherein the hybrid material comprises a semiconducting, ferroelectric, and/or magnetic perovskite structure.

4. The hybrid material of claim 1, wherein the hybrid material has a formula $A_2MX_4$ or $A'MX_4$, wherein A and A' are organic cations, M is a divalent metal cation, and X is a halide anion.

5. The hybrid material of claim 4, wherein the hybrid material has a formula $A_2MX_4$, wherein A is an organic cation having a formula $R-NH_3^+$, wherein R is an alkyl, aryl, or arylalkyl group.

6. The hybrid material of claim 5, wherein A has a formula:

wherein: le is a bicyclic, tricyclic or tetracyclic aryl, or a bicyclic, tricyclic, or tetracyclic heteroaryl; $R^2$ is hydrogen, $C_1$-$C_4$ alkyl, hydroxy, amino, or halo; m is 0, 1, 2, 3, or 4; and n is 0, 1, 2, 3, or 4.

7. The hybrid material of claim 5, wherein R is a (S)-(–)-1-(1-naphthyl)ethyl group or a (R)-(+)-1-(1-naphthyl)ethyl group.

8. The hybrid material of claim 4, wherein M is selected from $Pb^{2+}$, $Sn^{2+}$, $Ge^{2+}$, $Ce^{2+}$, $Ni^{2+}$, $Co^{2+}$, $Fe^{2+}$, $Mn^{2+}$, $V^{2+}$, $Pd^{2+}$, $Cd^{2+}$, $Pt^{2+}$, $Rh^{2+}$, $Eu^{2+}$, $Yb^{2+}$, and $Sm^{2+}$, or any combination thereof.

9. The hybrid material of claim 4, wherein the halide anion is selected from iodide, bromide, chloride, and fluoride, or any combination thereof.

10. The hybrid material of claim 1, wherein the hybrid material has a formula $A_2M^1M^2X_6$, where A is an organic cation, $M^1$ is a monovalent metal cation, $M^2$ is a trivalent metal cation, and X is a halide anion.

11. The hybrid material of claim 1, wherein the hybrid material has the following characteristic temperature relationship: $T_g < T_x < T_m < T_d$,
wherein $T_g$ is glass transition temperature, $T_x$ is crystallization onset temperature, $T_m$ is melting onset temperature, and $T_d$ is degradation onset temperature.

12. The hybrid material of claim 1, wherein the hybrid material is provided as a film, a sheet, a fiber, and/or a thick section.

13. The hybrid material of claim 1, wherein the hybrid material is provided as a film supported on a substrate, wherein the substrate comprises silicon, silicon dioxide, quartz, glass, plastic, metal, or any combination thereof, and wherein the melting temperature of the hybrid material is less than the melting temperature of the substrate.

14. A method for producing the organic-inorganic hybrid material of claim 1 in a glassy amorphous state, comprising:
preparing a solution of a metal halide and an organic cation in a solvent;
depositing the solution onto a substrate; and
evaporating the solvent to produce a film of the hybrid material and impede the crystallization of the hybrid material.

15. The method of claim 14, wherein evaporating comprises rapidly drying the hybrid material using high-speed spin-coating, slit-casting and air knife blading, or ink jet printing,
wherein rapidly drying the hybrid material is achieved during a range of approximately 0.001-30 seconds, such that dynamics of crystallization for the switchable organic-inorganic hybrid are impeded.

16. The method of claim 14, wherein the solvent is selected from water, acetone, methanol, ethanol, propanol, isopropanol, ethylene glycol, acetonitrile, acetic acid, pyridine, chloroform, hydrazine, an amine, dimethylformamide, dimethyl sulfoxide, N-methyl-2-pyrrolidone, gamma-butyrolactone, or any combination thereof.

17. A process to prepare stable glass of the switchable organic-inorganic hybrid material of claim 1, comprising:
melting single crystals, powdered crystals and/or polycrystalline films of the hybrid material; and
cooling at a rate in the range of 1 K/min to $10^{10}$ K/min such that the kinetics of crystallization are impeded.

18. The process of claim 17, wherein the melt is held for a sufficient length of time to form a uniform melt without degradation.

19. The process of claim 17, wherein pressure is used to constrain the melt between substrates to produce a laminated glassy amorphous film upon cooling.

20. The process of claim 17, comprising removing a substrate after melt formation to produce a glassy amorphous film only on one surface upon cooling.

* * * * *

UNITED STATES PATENT AND TRADEMARK OFFICE
CERTIFICATE OF CORRECTION

PATENT NO.         : 11,825,728 B2
APPLICATION NO.    : 17/333862
DATED              : November 21, 2023
INVENTOR(S)        : Akash Singh, Manoj Jana and David B. Mitzi It is certified that error appears in the above-identified patent and that said Letters Patent is hereby corrected as shown below:

In the Claims

Claim 6, Column 21, Line 18 "1e" should read -- $R^1$ --;

Claim 8, Column 21, Line 26 "from $Pb^{2+}$, $Sn^{2+}$, $Ge^{2+,}$ $Ce^{2+}$, $Ni^{2+}$" should read -- from $Pb^{2+}$, $Sn^{2+}$, $Ge^{2+}$, $Cu^{2+}$, $Cr^{2+}$, $Ni^{2+}$ --.

Signed and Sealed this
Twelfth Day of March, 2024

Katherine Kelly Vidal
Director of the United States Patent and Trademark Office